(12) United States Patent
Min et al.

(10) Patent No.: US 11,430,912 B2
(45) Date of Patent: Aug. 30, 2022

(54) LIGHT EMITTING ELEMENT, METHOD OF MANUFACTURING THE SAME, AND DISPLAY DEVICE INCLUDING THE SAME

(71) Applicant: SAMSUNG DISPLAY CO., LTD., Yongin-si (KR)

(72) Inventors: Jung Hong Min, Pyeongtaek-si (KR); Dae Hyun Kim, Hwaseong-si (KR); Seung A Lee, Seoul (KR); Hyun Min Cho, Seoul (KR); Jong Hyuk Kang, Suwon-si (KR); Dong Uk Kim, Hwaseong-si (KR); Hyun Deok Im, Seoul (KR); Hyung Rae Cha, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 83 days.

(21) Appl. No.: 17/110,574

(22) Filed: Dec. 3, 2020

(65) Prior Publication Data

US 2021/0091255 A1 Mar. 25, 2021

Related U.S. Application Data

(63) Continuation of application No. 16/274,109, filed on Feb. 12, 2019, now Pat. No. 10,862,000.

(30) Foreign Application Priority Data

Jun. 11, 2018 (KR) .................. 10-2018-0066819

(51) Int. Cl.
*H01L 33/00* (2010.01)
*H01L 27/15* (2006.01)
(Continued)

(52) U.S. Cl.
CPC .......... *H01L 33/007* (2013.01); *H01L 21/302* (2013.01); *H01L 27/156* (2013.01); *H01L 33/32* (2013.01); *H01L 2933/0016* (2013.01)

(58) Field of Classification Search
CPC ... H01L 21/302; H01L 33/0095; H01L 33/24; H01L 33/38; H01L 27/156; H01L 2933/0016
See application file for complete search history.

(56) References Cited

U.S. PATENT DOCUMENTS 5,728,215 A 3/1998 Itagaki et al.
9,171,717 B2 10/2015 Ju et al.
(Continued)

FOREIGN PATENT DOCUMENTS

EP 3832738 A1 * 6/2021 .......... H01L 27/156
JP 2013-4661 A 1/2013
KR 10-2015-0025438 3/2015

OTHER PUBLICATIONS

EPO Extended Search Report dated Nov. 7, 2019, for corresponding European Patent Application No. 19175488.6, (8 pages).

*Primary Examiner* — Allan R Wilson
(74) *Attorney, Agent, or Firm* — Lewis Roca Rothgerber Christie LLP

(57) ABSTRACT

A light emitting element, a method of manufacturing a light emitting element, and a display device including a light emitting element are provided. A method of manufacturing a light emitting element includes: preparing a lower panel including a substrate and a first sub conductive semiconductor layer on the substrate; forming a first mask layer including at least one mask pattern on at least a part of the lower panel to be spaced apart from each other and an opening region in which the mask patterns are spaced apart from each other; laminating a first conductive semiconductor layer, an active material layer, and a second conductive
(Continued)

semiconductor layer on the first mask layer to form an element laminate; etching the element laminate in a vertical direction to form an element rod; and removing the mask pattern to separate the element rod from the lower panel.

15 Claims, 21 Drawing Sheets

(51) Int. Cl.
*H01L 33/32* (2010.01)
*H01L 21/302* (2006.01)

(56) References Cited

U.S. PATENT DOCUMENTS

| | | |
|---|---|---|
| 2005/0074393 A1 | 4/2005 | Wu et al. |
| 2007/0155025 A1 | 7/2007 | Zhang et al. |
| 2008/0279242 A1 | 11/2008 | Bour |
| 2012/0326181 A1 | 12/2012 | Shibata et al. |
| 2014/0353582 A1 | 12/2014 | Kim et al. |
| 2015/0214429 A1 | 7/2015 | Iizuka et al. |
| 2016/0126419 A1 | 5/2016 | Kum et al. |
| 2017/0076986 A1 | 3/2017 | Forrest et al. |
| 2018/0010754 A1 | 1/2018 | Albou et al. |
| 2018/0019377 A1 | 1/2018 | Kim et al. |
| 2018/0261785 A1 | 9/2018 | Ahmed et al. |

\* cited by examiner

LIGHT EMITTING ELEMENT, METHOD OF MANUFACTURING THE SAME, AND DISPLAY DEVICE INCLUDING THE SAME

CROSS-REFERENCE TO RELATED APPLICATIONS

This application is continuation of U.S. patent application Ser. No. 16/274,109, filed on Feb. 12, 2019, which claims priority to and the benefit of Korean Patent Application No. 10-2018-0066819, filed on Jun. 11, 2018 in the Korean Intellectual Property Office, the entire disclosures of each of which are incorporated herein by reference.

BACKGROUND

1. Field

Aspects of embodiments of the present invention relate to a light emitting element, a method of manufacturing the same, and a display device including a light emitting element.

2. Description of Related Art

The importance of a display device has increased with the development of multimedia. Accordingly, various types of display devices, such as an organic light emitting display (OLED) and a liquid crystal display (LCD) have been used.

A display device for displaying an image includes a display panel, such as an organic light emitting display panel or a liquid crystal display panel. Among display panels, an organic light emitting display panel includes an organic light emitting element, such as a light emitting diode (LED). The light emitting diode (LED) includes an organic light emitting diode (OLED) using an organic material as a fluorescent material and an inorganic light emitting diode using an inorganic material as a fluorescent material.

The organic light emitting diode (OLED), in which an organic material is used as a fluorescent material of a light emitting element, is advantageous in that a manufacturing process is simple and a display element has flexible properties. However, it is known that an organic material is vulnerable to high-temperature driving environments, and an efficiency of blue light is relative low.

In contrast, the inorganic light emitting diode, in which an inorganic semiconductor is used as a fluorescent material, is advantageous in that it has durability even in high-temperature environments, and it has a higher blue light efficiency than the organic light emitting diode (OLED). In addition, a transfer method using a dielectrophoresis (DEP) method has been developed in a manufacturing process which has been pointed out as a limitation of a conventional inorganic light emitting diode. Thus, research on inorganic light emitting diodes having excellent durability and efficiency compared to organic light emitting diodes is continuing.

An inorganic light emitting diode may be manufactured by growing a semiconductor layer doped with n-type or p-type impurities and an inorganic fluorescent material layer on a substrate, forming rods having a specific shape, and then separating these rods. However, when a physical method is used in separating a light emitting element, there is a problem in that the light emitting element may be separated such that a lengthwise side surface thereof is not smooth. When one side surface of the light emitting element is rugged or has an uneven shape or roughness, there may be a problem that a short failure occurs when the light emitting element is brought into contact with a contact electrode.

SUMMARY

According to an aspect of embodiments of the present invention, a light emitting element having a flat end connected to a contact electrode, and a method of manufacturing the same are provided. According to another aspect of embodiments of the present invention, a light emitting element having a smooth side surface, a method of manufacturing the same, and a display device including the light emitting element are provided.

According to another aspect of embodiments of the present invention, a display device including a light emitting element is provided, in which a problem of disconnection of an electrode material or a short failure occurring when the light emitting element is connected to the contact electrode may be eliminated.

However, aspects of the present invention are not restricted to those set forth herein. The above and other aspects of the present invention will become more apparent to one of ordinary skill in the art to which the present invention pertains by referencing the detailed description of the present invention given below.

According to one or more exemplary embodiments of the present disclosure, a method of manufacturing a light emitting element comprises: preparing a lower panel including a substrate and a first sub conductive semiconductor layer on the substrate; forming a first mask layer including at least one mask pattern on at least a part of the lower panel to be spaced apart from each other and an opening region in which the mask patterns are spaced apart from each other; laminating a first conductive semiconductor layer, an active material layer, and a second conductive semiconductor layer on the first mask layer to form an element laminate; etching the element laminate in a vertical direction to form an element rod; and removing the mask pattern to separate the element rod from the lower panel.

In an exemplary embodiment, the forming of the element laminate comprises: growing semiconductor crystals of the first sub conductive semiconductor layer in a vertical direction in the region in which the mask patterns are spaced apart from each other; growing the semiconductor crystals on the mask pattern of the first mask layer in a horizontal direction; and merging crystal grains of the semiconductor crystals on the mask pattern.

In an exemplary embodiment, the forming of the element rod comprises: forming a second mask layer on the element laminate, the second mask layer including a hard mask layer and a nanopattern layer in which at least one nanopattern is spaced apart from each other on the hard mask layer; vertically etching a region in which the nanopatterns are spaced apart from each other to form a hole; and removing the second mask layer.

In an exemplary embodiment, the method of manufacturing the light emitting element further comprises: forming an electrode material layer between the element laminate and the hard mask layer.

In an exemplary embodiment, the forming of the light emitting element comprises: forming an insulating film on a side surface of the element rod; and dissolving the mask pattern to separate the element rod provided with the insulating film from the lower panel.

In an exemplary embodiment, the light emitting element includes a separation surface, at which the element rod is separated from the lower panel, and which is substantially flat and is parallel to an upper surface of the second conductive semiconductor layer.

In an exemplary embodiment, the separation surface of the light emitting element has a surface roughness from 8 nm Ra to 12 nm Ra.

In an exemplary embodiment, the mask pattern includes at least one selected from silicon oxide (SiOx), silicon nitride (SiNx), silicon oxynitride (SiOxNy), ITO, ZnO, IGO, graphene, and graphene oxide.

In an exemplary embodiment, the mask pattern has a structure in which at least one layer is laminated, an insulating material layer including an insulating material is on a surface contacting the lower panel, and a conductive material layer including a conductive material is on the insulating material.

In an exemplary embodiment, the conductive material layer is attached to the light emitting element in the forming of the mask pattern to form an electrode layer.

In an exemplary embodiment, in the first mask layer, the opening has a circular cross-sectional structure.

In an exemplary embodiment, in the first mask layer, the at least one mask pattern is between a side of the lower substrate and another side thereof facing the side thereof, and is arranged to be spaced apart from each other in a second direction perpendicular to the first direction in which the mask pattern is connected to form the opening.

In an exemplary embodiment, in the first mask layer, a ratio of a length of the mask pattern measured in the second direction to a length of the opening measured in the second direction is from 2.5:1 to 3.5:1.

According to one or more exemplary embodiments of the present application, a light emitting element comprises: a first semiconductor layer doped with a first polarity; an active layer on the first semiconductor layer; a second semiconductor layer doped with a second polarity opposite to the first polarity; and an insulating layer located to surround side surfaces of the first semiconductor layer, the second semiconductor layer, and the active layer, wherein a lower surface of the first semiconductor layer is substantially flat and is parallel to an upper surface of the second semiconductor layer.

In an exemplary embodiment, the light emitting element further comprises: at least one electrode layer on the lower surface of the first semiconductor layer and the upper surface of the second semiconductor layer.

In an exemplary embodiment, the lower surface of the first semiconductor layer and the upper surface of the second semiconductor layer have a surface roughness from 8 nm Ra to 12 nm Ra.

According to one or more exemplary embodiments of the present disclosure, a display device comprises: a base substrate; first and second electrodes spaced apart from each other; a first contact electrode on an upper surface of the first electrode; a second contact electrode on an upper surface of the second electrode; and at least one light emitting element in a region in which the first electrode and the second electrode are spaced apart from each other, wherein both side surfaces of the light emitting element contacting the first contact electrode and the second contact electrode have a flat shape to be parallel to a surface perpendicular to the base substrate.

In an exemplary embodiment, the light emitting element comprises: an n-type semiconductor layer; an active layer on the n-type semiconductor layer to emit light of a specific wavelength band; a p-type semiconductor layer on the active layer; and an insulating film surrounding side surfaces of the n-type semiconductor layer, the p-type semiconductor layer, and the active layer, wherein a length measured in a direction in which the n-type semiconductor layer and the p-type semiconductor layer are laminated is longer than a vertical length between the first electrode and the second electrode.

In an exemplary embodiment, the first contact electrode and the second contact electrode are in vertical contact with the base substrate in a region contacting the light emitting element.

In an exemplary embodiment, the display device further comprises: at least one passivation layer on an outer surface of the insulating layer of the light emitting element.

BRIEF DESCRIPTION OF THE DRAWINGS

The above and other aspects and features of the present invention will become more apparent by describing in further detail some exemplary embodiments thereof with reference to the attached drawings, in which.

DETAILED DESCRIPTION

The present invention will now be described more fully herein with reference to the accompanying drawings, in which some exemplary embodiments of the invention are shown. This invention may, however, be embodied in different forms and should not be construed as limited to the embodiments set forth herein. Rather, these embodiments are provided such that this disclosure will be thorough and complete, and will fully convey the scope of the invention to those skilled in the art.

It is to be understood that when a layer is referred to as being "on" another layer or substrate, it may be directly on the other layer or substrate, or one or more intervening layers may also be present. The same reference numbers indicate the same components throughout the specification.

It is to be understood that, although the terms "first," "second," etc. may be used herein to describe various elements, these elements should not be limited by these terms. These terms are used to distinguish one element from another element. For instance, a "first" element discussed below could be termed a "second" element without departing from the teachings of the present invention. Similarly, the "second" element could also be termed the "first" element.

Herein, embodiments of the present invention will be described with reference to the attached drawings.

Figure 1:
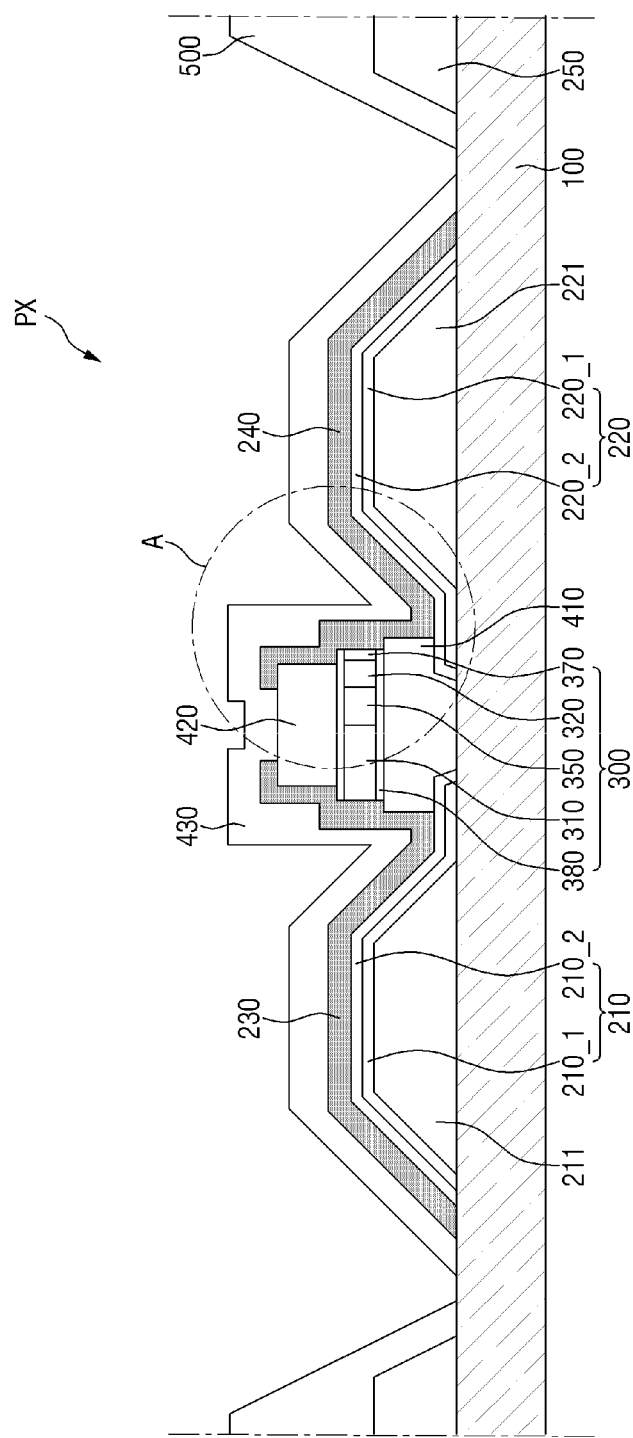
FIG. 1 is a cross-sectional view of a pixel of a display device according to an embodiment.

FIG. 1 is a cross-sectional view of a pixel of a display device according to an embodiment.

The display device according to an embodiment may include a pixel PX. The pixel PX emits light of a specific wavelength band, and is disposed on a display unit of the display device to display a series of information to be provided to a user. Although FIG. 1 illustrates a case in which the display device includes one pixel PX, the present invention is not limited thereto, and it will be understood that the display device includes a plurality of pixels PX.

The pixel PX may include a plurality of light emitting elements 300 and may emit light of different wavelengths. For example, the light emitting element 300 may emit light of blue, green, and red wavelengths, and, thus, the pixel PX may be realized as a pixel emitting blue, green, and red light. However, the present invention is not limited thereto. In some cases, all of the light emitting elements 300 emit light of a wavelength band of the same color, such that the pixels PX emit light of the same color (for example, blue). Further, the light emitting elements 300 emitting light of wavelength bands of different colors may be disposed in one pixel PX to emit light of different colors, for example, white light.

The pixel PX includes a base substrate 100, a plurality of electrodes 210 and 220 disposed on the base substrate 100, contact electrodes 230 and 240 disposed on the respective electrodes 210 and 220, and a plurality of light emitting elements 300 connected to the respective contact electrodes 230 and 240. The unit pixel PX may further include an outer partition wall 500 to distinguish the unit pixel PX from each adjacent pixel PX. Herein, the pixel PX will be described in more detail.

The pixel PX includes a base substrate 100, and a first electrode 210 and a second electrode 220 disposed on the base substrate 100 to face each other. Reflective partition walls 211 and 221 may be disposed on the base substrate 100. The first electrode 210 and the second electrode 220 may be disposed on the reflective partition walls 211 and 221 to cover the reflective partition walls 211 and 221, respectively. The partition walls 211 and 221 may be formed of an organic material, such as polyimide, but the present invention is not limited thereto.

The light emitting element 300 may be disposed between the first electrode 210 and the second electrode 220 spaced apart from each other. Although it is illustrated in FIG. 1 that the first electrode 210 and the second electrode 220 are directly disposed on the base substrate 100, the present invention is not limited thereto, and other layers or structures may be disposed between the base substrate 100 and the first and second electrodes 210 and 220. For example, a buffer layer, a thin film transistor, or the like may be disposed on the base substrate 100, and the first electrode 210 and the second electrode 220 may be disposed thereon.

The base substrate 100 may support structures disposed thereon, for example, the reflective partition walls 211 and 221, the first and second electrodes 210 and 220, the light emitting element 300, and the outer partition wall 500. The base substrate 100 may be any of a glass substrate, a quartz substrate, a sapphire substrate, a plastic substrate, and a flexible polymer film, but is not limited thereto.

The first electrode 210 and the second electrode 220 may be disposed on the base substrate 100 so as to be spaced apart from each other and face each other. The first electrode 210 and the second electrode 220 may receive an electric signal applied from an electrode line 250. The applied electric signal is transmitted to the light emitting element 300 disposed between the first electrode 210 and the second electrode 220 to allow the light emitting element 300 to emit light.

The first electrode 210 may be electrically connected to a first electrode line 250 extending in a direction to receive an electrical signal from the first electrode line 250. The second electrode 220 may be electrically connected to a second electrode line (not shown) extending in a direction perpendicular to the direction in which the first electrode line 250 is disposed, to receive an electrical signal from the second electrode line (not shown).

In an embodiment, the first electrode 210 and the second electrode 220 may be spaced apart from each other by a distance (e.g., a predetermined distance), and the distance may be shorter than the length of the light emitting element 300. When the length of the light emitting element 300 is shorter than the distance between the first electrode 210 and the second electrode 220, the light emitting element 300 may not receive an electrical signal applied from the electrode line 250 because a contact with the electrodes is not formed.

The first electrode 210 and the second electrode 220 may include the reflective partition walls 211 and 221, reflective partition wall layers 210_1 and 220_1 formed on the reflective partition walls 211 and 221, and reflective partition wall electrode layers 210_2 and 220_2 formed on the reflective partition wall layers 210_1 and 220_1, respectively.

The reflective partition wall layers 210_1 and 220_1 may reflect light emitted from the light emitting element 300 to transmit light toward the outside of the display device. The light emitted from the light emitting element 300 is emitted in all directions without directionality. The light directed to the reflective partition wall layers 210_1 and 220_1 may be reflected and transmitted toward the outside of the display device, for example, the upper side of the reflective partition wall layers 210_1 and 220_1. Accordingly, the light emitted from the light emitting element 300 may be concentrated in a direction to increase light efficiency. The reflective partition wall layers 210_1 and 220_1 may include a material having a high reflectance to reflect light emitted from the light emitting element 300. For example, the reflective partition wall layers 210_1 and 220_1 may include a material such as silver (Ag), but the present invention is not limited thereto.

The reflective partition wall electrode layers 210_2 and 220_2 may be formed on the reflective partition wall layers 210_1 and 220_1 and may be connected to the electrode lines 250. The reflective partition wall electrode layers 210_2 and 220_2 may transmit an electric signal applied to the contact electrodes 230 and 240 through the electrode line 250. The reflective partition wall electrode layers 210_2 and 220_2 may include a transparent conductive material. For example, the reflective partition wall electrode layers 210_2 and 220_2 may include a material such as ITO, IZO, or IGO, but the present invention is not limited thereto.

In an embodiment, as shown in FIG. 1, the first electrode 210, the second electrode 220, the light emitting element 300, the first contact electrode 230, and the second contact electrode 240 may be covered by a plurality of insulating material layers 410, 420, and 430.

In an embodiment, in order to protect the reflective partition wall electrode layers 210_2 and 220_2, a first insulating material layer 410 may be disposed between the first electrode 210 and the second electrode 220. As shown in FIG. 1, the first insulating material layer 410 may be disposed between the first electrode 210 and the second electrode 220, and the light emitting element 300 may be aligned thereon. The first insulating material layer 410 may include a material such as silicon oxide (SiOx), silicon nitride (SiNx), silicon oxynitride (SiOxNy), aluminum oxide ($Al_2O_3$), or aluminum nitride (AlN), but the present invention is not limited thereto. The first insulating layer 410 protects the reflective partition wall electrode layers 210_2 and 220_2 of the first electrode 210 and the second electrode 220, and may prevent semiconductor layers 310 and 320 of the light emitting element 300 from being in direct contact with other substrates, thereby preventing or substantially preventing damage of the light emitting element 300.

In order to transmit an electrical signal applied from the electrode line 250, the first contact electrode 230 and the second contact electrode 240 may be disposed on the upper surfaces of the reflective partition wall electrode layers 210_2 and 220_2. The first contact electrode 230 and the second contact electrode 240 may be connected to the first semiconductor layer 310 and the second semiconductor layer 320 of the light emitting element 300, respectively. The first contact electrode 230 and the second contact electrode 240 may transmit an electric signal applied to the reflective partition wall electrode layers 210_2 and 220_2 to the light emitting element 300 through the electrode line 250 to emit light.

The first contact electrode 230 and the second contact electrode 240 may include a conductive material, for example, ITO, IZO, IGO, or aluminum (Al). However, the present invention is not limited thereto.

In order to protect and electrically isolate the first contact electrode 230 and the second contact electrode 240, the first contact electrode 230 and the second contact electrode 240 are disposed on the light emitting element 300 to be spaced apart from each other, and the second insulating material layer 420 may be disposed in the spaced region. In an embodiment, the second insulating material layer 420 is the same as the first insulating material layer 410 except that the second insulating material layer 420 is formed on the light emitting element 300. Further details thereof will not be described.

A third insulating layer 430 may be formed on the first contact electrode 230, the second contact electrode 240, and the second insulating layer 420 to serve as a protective layer against external environments. When the contact electrodes 230 and 240 are exposed, they may be covered with the third insulating material layer 430 because a problem of disconnection of a contact electrode material due to electrode damage may occur. The third insulating layer 430 may be disposed to cover the first electrode 210, the second electrode 220, and the light emitting device 300. In an embodiment, the third insulating material layer 430 is the same as the first insulating material layer 410 except for the position at which it is disposed.

In an embodiment, at least one outer partition wall 500 is disposed on the base substrate 100 to distinguish the plurality of pixels PX. The plurality of outer partition walls 500 are spaced apart from each other, and the first electrode 210, the second electrode 220, and the light emitting element 300 are formed between the outer partition walls 500 spaced apart from each other as shown in FIG. 1. The outer partition wall 500 may be formed to cover the electrode line 250.

The pixels PX are separated by the outer partition wall 500 on the basis of the light emitting element 300 that emits light of a specific wavelength band. The outer partition wall 500 may prevent or substantially prevent the light emitting element 300 from moving to another adjacent pixel PX when aligning the light emitting elements 300. For example, the outer partition wall 500 may be made of polyimide (PI). However, the present invention is not limited thereto, and the material of the outer partition wall 500 is not particularly limited as long as its surface is made of a hydrophobic material.

The outer partition walls 500 may prevent or substantially prevent the color mixing of light emitted from the light emitting elements 300. When the adjacent pixels PX include light emitting elements 300 emitting light of different wavelength bands from each other, the colors of the light emitted from the respective pixels PX may be mixed. In order to prevent or substantially prevent this color mixing, the outer partition wall 500 is disposed between the pixels PX such that light emitted from one pixel PX cannot be incident on another pixel PX to prevent or substantially prevent color mixing, thereby improving the color purity of the display device.

The plurality of light emitting elements 300 disposed between the first electrode 210 and the second electrode 220 each may include an active layer 350 to emit light of a specific wavelength band as described above. The light emitting elements 300 may emit light of different wavelength bands, or may emit light of the same wavelength band.

The light emitting element 300 according to an embodiment may be manufactured by an epitaxial growth method on a substrate. A seed crystal layer for forming a semiconductor layer may be formed on a substrate, and a desired semiconductor material may be deposited and grown. Crystals are grown on the seed crystal layer to form a plurality of semiconductor layers 310 and 320, thereby manufacturing the light emitting element 300. The manufactured light emitting element 300 may be separated from the substrate and aligned between the first electrode 210 and the second electrode 220. Herein, a structure of the light emitting element 300 will be described with reference to FIGS. 2 to 6.

Figure 2:
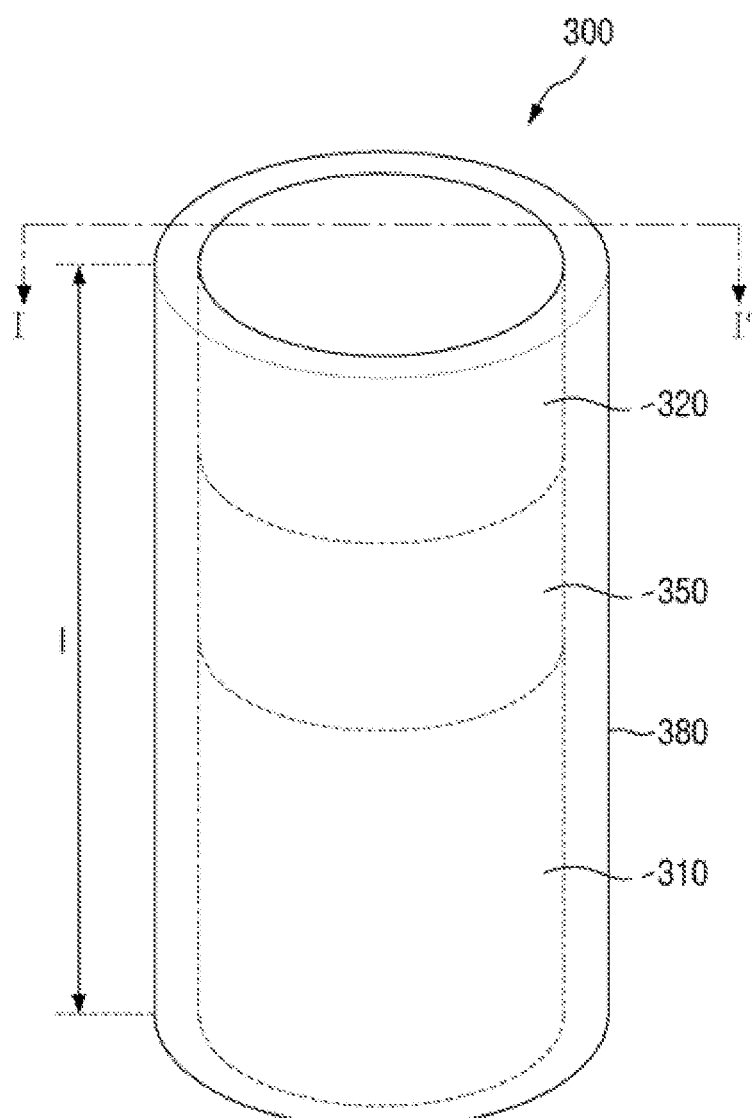
FIG. 2 is a schematic view of a light emitting element according to an embodiment.
Figure 3:
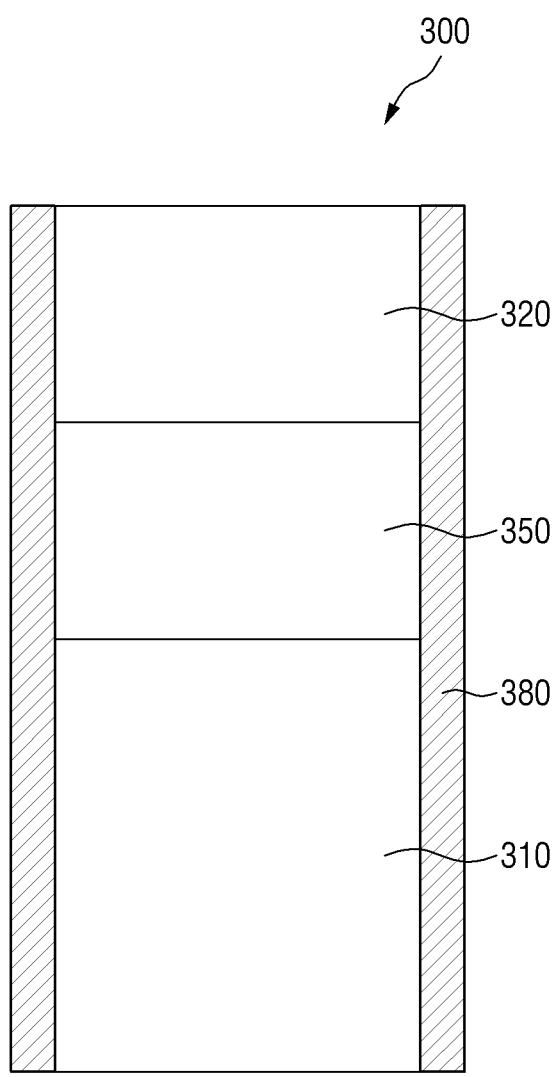
FIG. 3 is a cross-sectional view taken along the line I-I' of FIG. 2.

FIG. 2 is a schematic view of a light emitting element 300 according to an embodiment; and FIG. 3 is a cross-sectional view taken along the line I-I' of FIG. 2.

Referring to FIGS. 2 and 3, the light emitting element 300 may include a plurality of semiconductor layers 310 and 320 and an active layer 350 disposed between the plurality of semiconductor layers 310 and 320. The electrical signal applied from the first electrode 210 and the second electrode 220 is transmitted to the active layer 350 through the plurality of semiconductor layers 310 and 320 to emit light.

In an embodiment, the light emitting element 300 includes a first semiconductor layer 310, a second semiconductor layer 320, an active layer between the first semiconductor layer 310 and the second semiconductor layer 320, and an insulating layer 380. The light emitting element 300 of FIG. 2 illustrates a structure in which the first semiconductor layer 310, the active layer 350, and the second semiconductor layer 320 are sequentially laminated in the length direction.

In an embodiment, the first semiconductor layer 310 may be an n-type semiconductor layer. For example, when the light emitting element 300 emits light of a blue wavelength band, the first semiconductor layer 310 may be formed of a semiconductor material having a chemical formula of $In_xAl_yGa_{1-x-y}N$ ($0 \leq x \leq 1$, $0 \leq y \leq 1$, $0 \leq x+y \leq 1$). For example, the semiconductor material may be at least one of InAlGaN, GaN, AlGaN, InGaN, AlN, and InN, doped with n-type purities. The first semiconductor layer 310 may be doped with a first conductive dopant. For example, the first conductive dopant may be Si, Ge, or Sn. The length of the first semiconductor layer 310 may be in a range from 1.5 μm to 5 μm, but is not limited thereto.

In an embodiment, the second semiconductor layer 320 may be a p-type semiconductor layer. For example, when the light emitting element 300 emits light of a blue wavelength band, the second semiconductor layer 320 may be formed of a semiconductor material having a chemical formula of $In_xAl_yGa_{1-x-y}N$ ($0 \leq x \leq 1$, $0 \leq y \leq 1$, $0 \leq x+y \leq 1$). For example, the semiconductor material may be at least one of InAlGaN, GaN, AlGaN, InGaN, AlN, and InN, doped with p-type purities. The second semiconductor layer 320 may be doped with a second conductive dopant. For example, the second conductive dopant may be Mg, Zn, Ca, Se, or Ba. The length of the second semiconductor layer 320 may be in a range from 0.08 µm to 0.25 µm, but is not limited thereto.

In the present specification, a case in which the first semiconductor layer 310 and the second semiconductor layer 320 are an n-type semiconductor layer and a p-type semiconductor layer, respectively, will be described as an example. However, the present invention is not limited thereto, and a case in which the first semiconductor layer 310 is a p-type semiconductor layer and the second semiconductor layer 320 is an n-type semiconductor layer may also be included.

The active layer 350 is disposed between the first semiconductor layer 310 and the second semiconductor layer 320, and may include a material having a single or multiple quantum well structure. When the active layer 350 includes a material having a multiple quantum well structure, the active layer 350 may have a structure in which a plurality of quantum layers and a plurality of well layers are alternately laminated. The active layer 350 may emit light by the coupling of electron-hole pairs according to an electrical signal applied through the first semiconductor layer 310 and the second semiconductor layer 320. For example, when the active layer 350 emits light of a blue wavelength band, it may include a material such as AlGaN or AlInGaN. In an embodiment, when the active layer 350 has a multiple quantum well structure in which quantum layers and well layers are alternately laminated, the quantum layers may include AlGaN or AlInGaN, and the well layers may include a material such as GaN or AlGaN. However, the present invention is not limited thereto, and the active layer 350 may include other Group 3 to Group 5 semiconductor materials depending on the wavelength band of the light to be emitted. Accordingly, the light emitted by the active layer 350 is not limited to the light of a blue wavelength band, and, in some cases, the active layer 350 may emit light of red and green wavelengths. The length of the active layer 350 may be in a range from 0.05 µm to 0.25 µm, but is not limited thereto.

Light emitted from the active layer 350 may be emitted not only to the lengthwise outer surface of the light emitting element 300 but also to both side surfaces thereof. That is, the directionality of the light emitted from the active layer 350 is not limited to one direction.

The insulating layer 380 may be formed outside the light emitting element 300 to protect the light emitting element 300. For example, the insulating layer 380 may be formed to surround the side surface of the light emitting element 300, and, thus, the insulating layer 380 may not be formed at both ends of the light emitting element 300 in the length direction, for example, at both ends thereof at which the first semiconductor layer 310 and the second semiconductor layer 320 are disposed. However, the present invention is not limited thereto. The insulating layer 380 may include any of materials having insulating properties, such as silicon oxide (SiOx), silicon nitride (SiNx), silicon oxynitride (SiOxNy), aluminum nitride (AlN), and aluminum oxide ($Al_2O_3$). Accordingly, it is possible to prevent an electrical short circuit that may occur when the active layer 350 is in direct contact with the first electrode 210 or the second electrode 220. Further, since the insulating layer 380 includes the active layer 350 to protect the outer surface of the light emitting element 300, it is possible to prevent or substantially prevent a decrease in luminous efficiency.

The thickness of the insulating layer 380 may be in a range from 0.5 µm to 1.5 µm, but is not limited thereto.

Referring to FIG. 2 again, the light emitting element 300 may have a cylindrical shape. However, the shape of the light emitting element 300 is not limited thereto, and the light emitting element 300 may have, but is limited to, any of various shapes, such as a cube, a rectangular parallelepiped, and a hexagonal column. In an embodiment, the light emitting element 300 may have a length l in a range of 1 µm to 10 µm or 2 µm to 5 µm, and, in an embodiment, a length of about 4 µm. In an embodiment, the light emitting element 300 may have a diameter in a range of 400 nm to 700 nm, and, in an embodiment, may have a thickness of about 500 nm. Herein, a case in which the light emitting element 300 is cylindrical will be described as an example.

Figure 4:
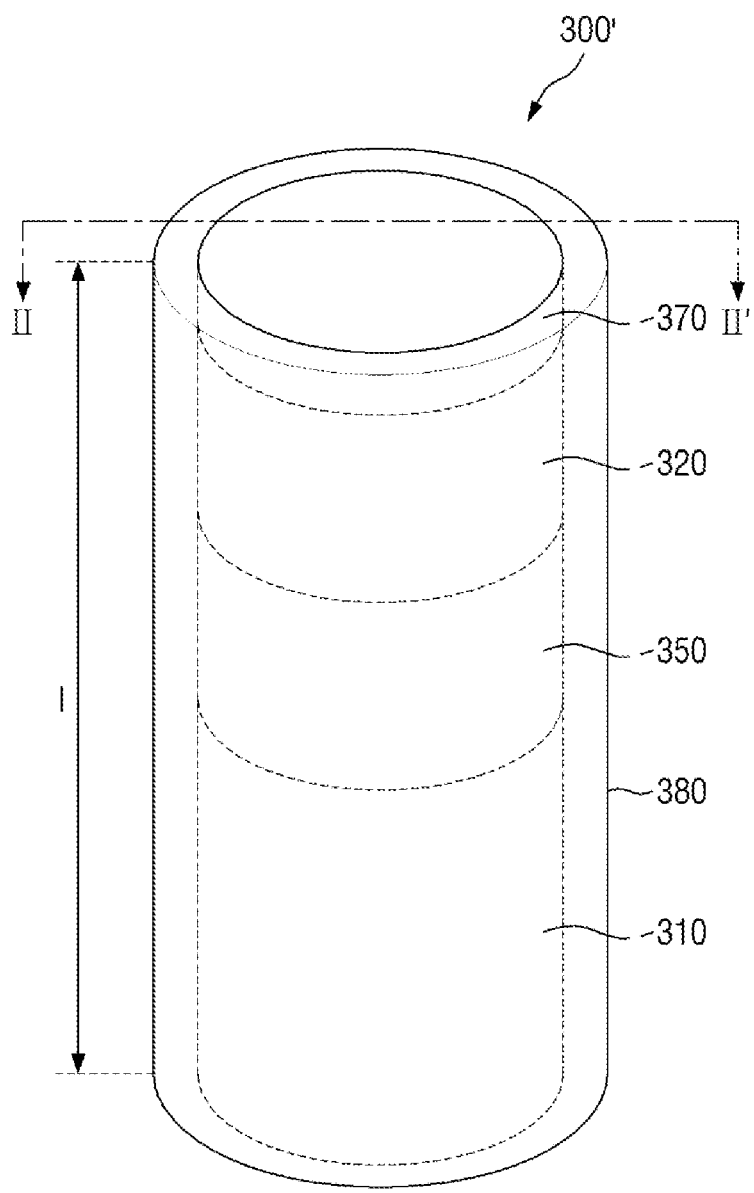
FIGS. 4 and 6 are schematic views of light emitting elements according to other embodiments.
Figure 5:
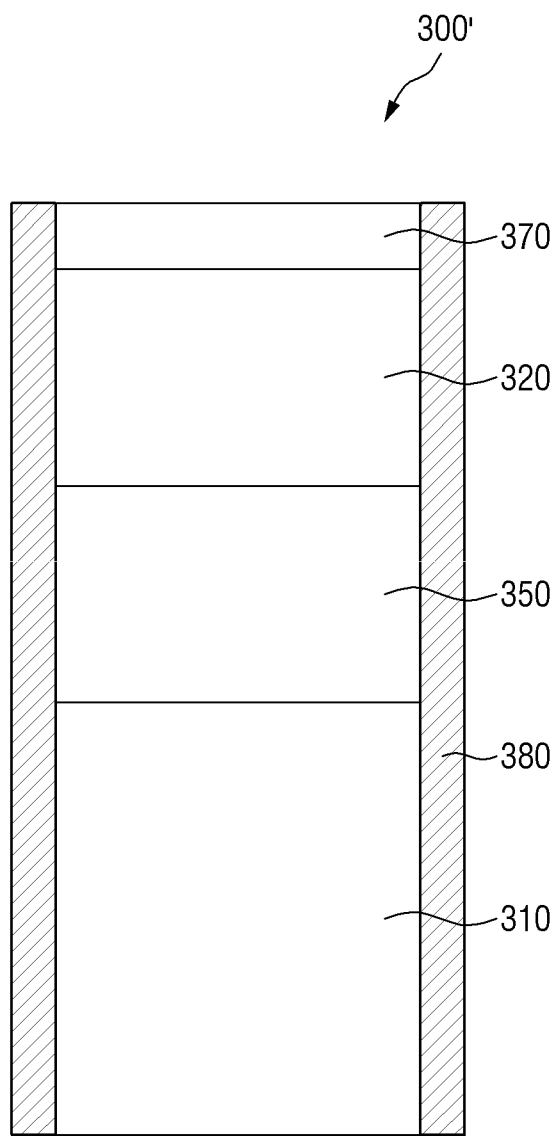
FIG. 5 is a cross-sectional view taken along the line II-II' of FIG. 4.
Figure 6:
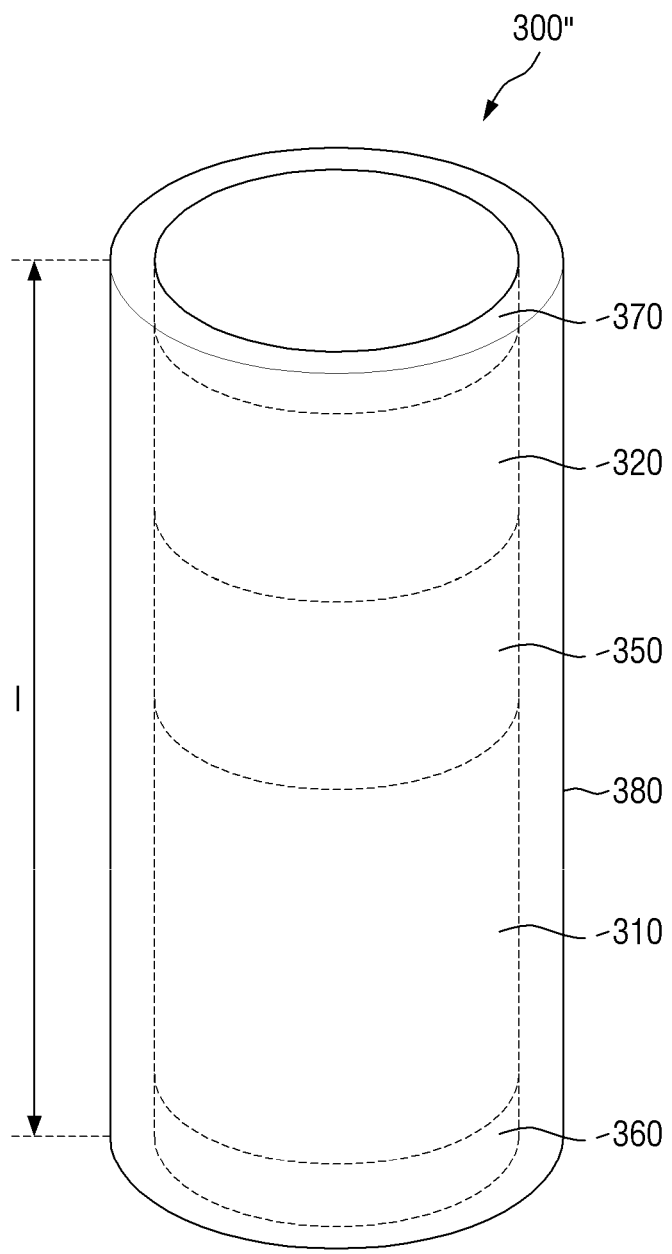

FIGS. 4 and 5 are a schematic view and a cross-sectional view taken along the line II-II' of FIG. 4, respectively, of a light emitting element 300' according to another embodiment; and FIG. 6 is a schematic view of a light emitting element 300" according to another embodiment.

The light emitting elements 300' and 300" may further include an electrode layer 360 or 370 on at least one of both side surfaces of the first semiconductor layer 310 and the second semiconductor layer 320.

The light emitting element 300' of FIGS. 4 and 5 illustrates a case in which the second semiconductor layer 320 further includes an electrode layer 370, and the light emitting element 300" of FIG. 6 illustrates a case in which the first semiconductor layer 310 and the second semiconductor layer 320 further include electrode layers 360 and 370, respectively. For the convenience of explanation, the electrode layer formed on one side surface of the first semiconductor layer 310 is referred to as a first electrode layer 360, and the electrode layer formed on the other side surface of the second semiconductor layer 320 is referred to as a second electrode layer 370. However, the present invention is not limited thereto, and any electrode layer may be referred to as a first electrode layer.

Referring to FIGS. 4 to 6, each of the light emitting elements 300' and 300" may include at least one of the first electrode layer 360 and the second electrode layer 370, and, in this case, the insulating layer 380 may extend in the length direction to cover the first electrode layer 360 and the second electrode layer 370. However, the present invention is not limited, and the insulating layer 380 may cover only the first semiconductor layer 310, the active layer 350, and the second semiconductor layer 320, or may cover only a part of the outer surface of the electrode layer 360 or 370 to expose a part of the outer surface of the electrode layer 360 or 370.

The first electrode layer 360 and the second electrode layer 370 may be ohmic contact electrodes. However, the present invention is not limited thereto, and the first electrode layer 360 and the second electrode layer 370 may be Schottky contact electrodes. The first electrode layer 360 and the second electrode layer 370 may include a conductive metal. For example, the first electrode layer 360 and the second electrode layer 370 may include at least one of aluminum (Al), titanium (Ti), indium (In), gold (Au), and silver (Ag). The first electrode layer 360 and the second electrode layer 370 may include the same material or may include different materials. However, the present invention is not limited thereto.

Herein, for the convenience of explanation, although the light emitting element 300' shown in FIG. 4 will be described as an example, like the light emitting elements shown in other drawings, the first electrode layer 360 and the second electrode layer 370 may be formed or both may be omitted.

Figure 7:
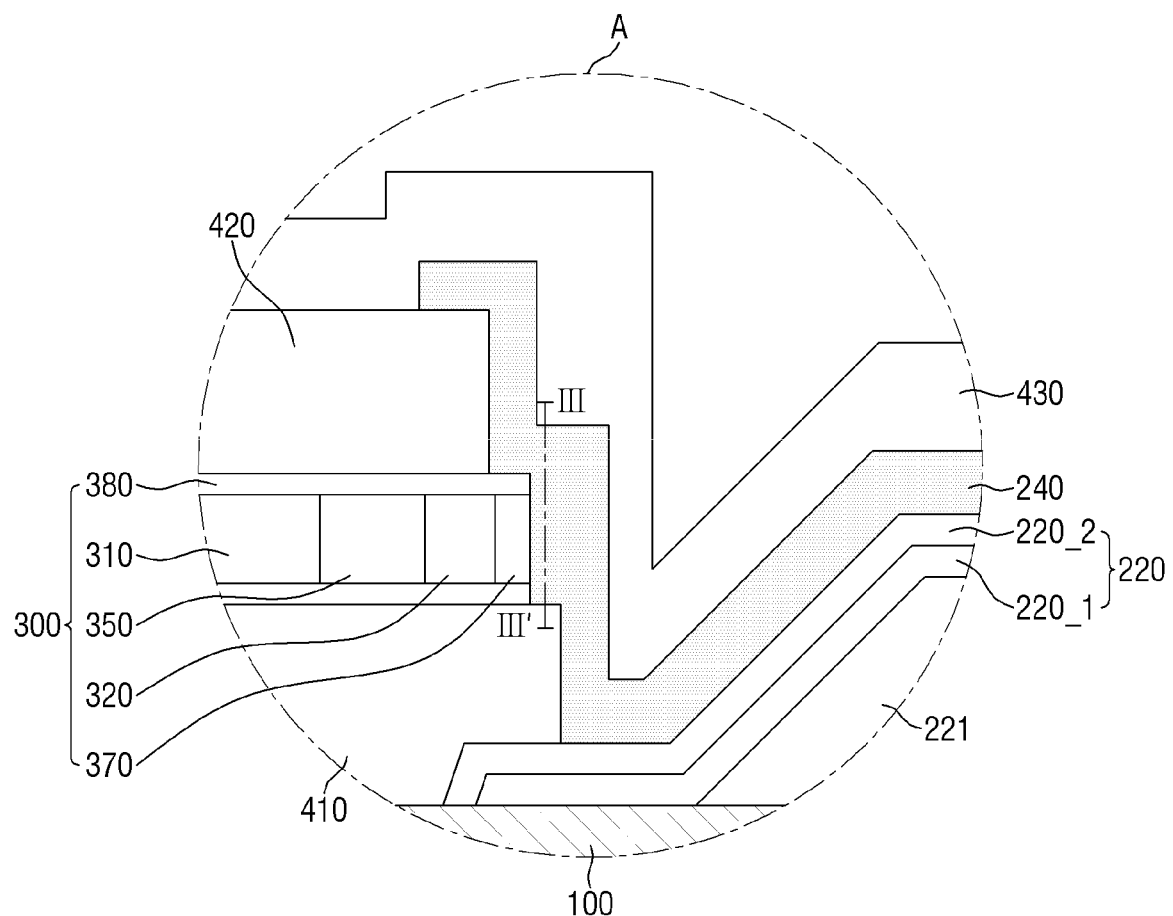
FIG. 7 is an enlarged view of a region "A" of FIG. 1.

FIG. 7 is an enlarged view of region "A" in FIG. 1.

Referring to FIG. 7, the light emitting element 300 may be connected to the first contact electrode 230 and the second contact electrode 240 to receive an electric signal.

In an embodiment, the light emitting element 300 may be connected to the first electrode 210 and the second electrode 220 through the contact electrodes 230 and 240 without directly contacting the first electrode 210 and the second electrode 220. Accordingly, when the light emitting element 300 is aligned between the first electrode 210 and the second electrode 220, even if a high voltage is applied to the first electrode 210 and the second electrode 220, a high voltage is not applied to the light emitting element 300, and thus damage may be prevented.

However, the light emitting element 300 is in contact with the first contact electrode 230 and the second contact electrode 240. As described above, the light emitting element 300 manufactured by an epitaxial method may have a separation surface from the substrate, the separation surface having an uneven structure or an inclined shape without being flat. Since the light emitting element 300 grown on the substrate is separated from the substrate by a physical method, the separation surface of the manufactured light emitting element 300 may not be flat, and may have a roughness.

Particularly, in the case in which a partially inclined region is formed on the separation surface of the light emitting element 300, when the light emitting element 300 aligned on the first contact electrode 230 and the second contact electrode 240 is connected to the contact electrodes 230 and 240, the materials of the contact electrodes may be disconnected. Thus, the contact electrodes 230 and 240 may be disconnected to cause a short failure, and an electric signal may not be applied to the light emitting element 300.

In order to prevent or substantially prevent this, the light emitting element 300 needs to have a smooth separation surface from the substrate. The method of manufacturing a light emitting element 300 according to an embodiment of the present invention may include a method of chemically separating a light emitting element 300 by forming a sacrificial layer on at least a part of a region in an element laminate grown by an epitaxial method and etching the sacrificial layer. Therefore, in the light emitting element 300 according to an embodiment, both side surfaces contacting the first contact electrode 230 and the second contact electrode 240 may have a flat shape so as to be parallel to a plane perpendicular to the substrate, and a problem of disconnection of materials of the contact electrodes may be prevented or substantially prevented. Herein, a method of manufacturing a light emitting element 300 according to an embodiment will be described in further detail with reference to FIGS. 8 to 20.

FIGS. 8 to 20 sequentially illustrate a method of manufacturing a light emitting device 300 according to an embodiment.

The method of manufacturing a light emitting device 300 according to an embodiment may include the steps of: preparing a lower panel 11 including a substrate 10 and a first sub conductive semiconductor layer 31' formed on the substrate 10; forming a first mask layer 20 including at least one mask pattern 21 disposed on at least a part of the lower panel 11 to be spaced apart from each other and an opening 22 which is a region in which the mask patterns 21 are spaced apart from each other; laminating a first conductive semiconductor layer 31, an active material layer 35, and a second conductive semiconductor layer 32 on the first mask layer 20 to form an element laminate 30'; etching the element laminate 30' in a vertical direction to form element rods 30; and removing the mask pattern 21 to separate the element rods 30 from the lower panel 11.

Figure 8:
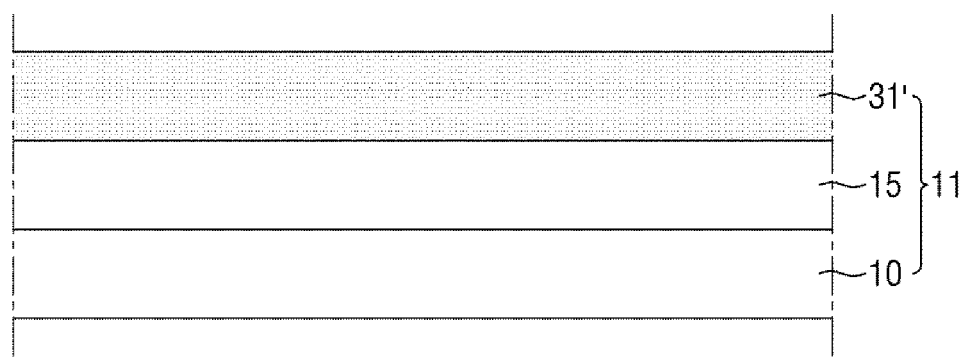
FIGS. 8 to 20 are views sequentially showing a method of manufacturing a light emitting element according to an embodiment.

First, a lower panel 11 in which a first sub conductive semiconductor layer 31' is laminated on a substrate 10 is prepared. As shown in FIG. 8, the lower panel 11 has a structure in which the substrate 10 and the first sub conductive semiconductor layer 31' are sequentially laminated. In an embodiment, the first sub conductive semiconductor layer 31' may include the same material as the first semiconductor layer 310 of the light emitting element 300. For example, the first sub conductive semiconductor layer 31' may be an n-type semiconductor layer, and may include the same material as the first semiconductor layer 310 doped with n-type impurities. However, the present invention is not limited thereto.

The substrate 10 may include any of a sapphire substrate ($Al_2O_3$) and a transparent substrate, such as a glass substrate. However, the present invention is not limited thereto, and the substrate 10 may be a conductive substrate including GaN, SiC, ZnO, Si, GaP, or GaAs. Herein, a case in which the lower panel 11 includes a sapphire substrate ($Al_2O_3$) will be described as an example.

The thickness of the substrate 10 is not particularly limited, but may be, for example, in the range of 400 μm to 1500 μm.

A plurality of conductive semiconductor layers is formed on the substrate 10. The plurality of conductive semiconductor layers grown by an epitaxial method may be grown by forming a seed crystal and depositing a material. In an embodiment, the plurality of semiconductor layers may be formed by physical vapor deposition (PVD), chemical vapor deposition (CVD), plasma laser deposition (PLD), dual-type thermal evaporation, sputtering, or metal organic chemical vapor deposition (MOCVD). In an exemplary embodiment, the plurality of semiconductor layers may be formed by metal organic chemical vapor deposition (MOCVD). However, the present invention is not limited thereto.

The precursor material for forming the plurality of conductive semiconductor layers is not particularly limited within a range that can be selected typically to form a target material. In an example, the precursor material may be a metal precursor including an alkyl group, such as a methyl group or an ethyl group. For example, the metal precursor may be a compound such as trimethylgallium ($Ga(CH_3)_3$), trimethylaluminum ($Al(CH_3)_3$), triethylphosphate ($(C_2H_5)_3PO_4$), but is not limited thereto.

A first sub conductive semiconductor layer 31' is formed on the substrate 10. As will be described later, in the method of manufacturing the light emitting element 30 according to an embodiment, a first mask layer is formed before the first semiconductor layer 310 of the light emitting element 300 is formed. Accordingly, the first sub conductive semiconductor layer 31' may provide seed crystals of the first semiconductor layer 310 growing on the first mask layer.

In an embodiment, at least one buffer layer 15 may be provided between the substrate 10 and the first sub conductive semiconductor layer 31'. As shown in FIG. 8, the buffer layer 15 may be formed on the substrate 10, and the first sub conductive semiconductor layer 31' may be formed on the buffer layer 15.

The buffer layer 15 may be provided to reduce a difference in lattice constant between the substrate 10 and the first sub conductive semiconductor layer 31'. Although the first sub conductive semiconductor layer 31' may be formed directly on the substrate 10, the buffer layer 15 may be formed to allow the crystals of the first sub conductive semiconductor layer 31' to be easily grown, so as to provide seed crystals. In an embodiment, the buffer layer 15 may be an undoped semiconductor layer, and the undoped semiconductor layer may include the same material as the first sub conductive semiconductor layer 31', but may be an undoped material. For example, the undoped semiconductor layer may include at least one of InAlGaN, GaN, AlGaN, InGaN, AlN, and InN, but is not limited thereto. Herein, a case in which an undoped semiconductor layer, as the buffer layer 15, is formed on the substrate 10.

Figure 9:
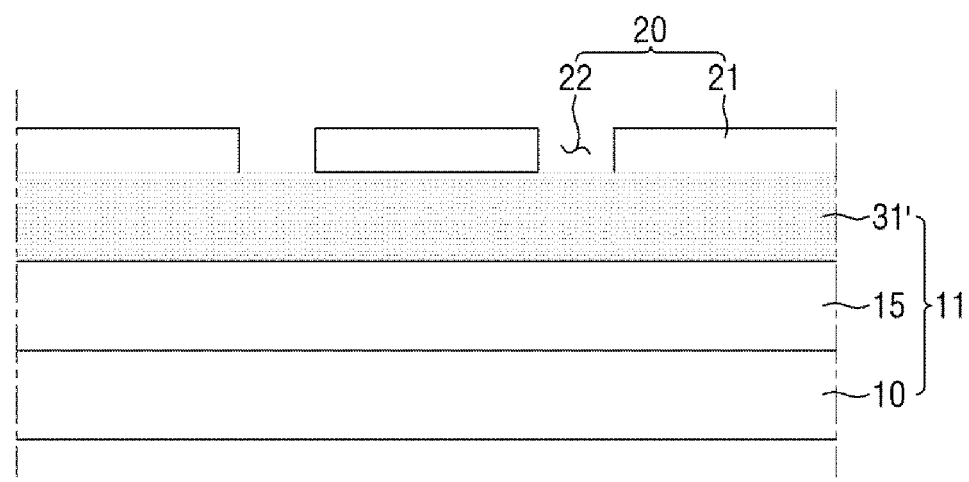

Next, as shown in FIG. 9, a first mask layer 20 including a plurality of mask patterns 21 is formed on at least a part of a region of the prepared lower panel 11. The first mask layer 20 may be configured such that the plurality of mask patterns 21 are spaced apart from each other. The first mask layer 20 may include openings 22 between the mask patterns 21 spaced apart from each other. The crystals of the first sub conductive semiconductor layer 31' may grow through the openings 22 of the first mask layer 20.

The mask pattern 21 of the first mask layer 20 may include at least one of an insulating material and a conductive material. For example, the insulating material may be silicon oxide (SiOx), silicon nitride (SiNx), or silicon oxynitride (SiOxNy), and the conductive material may be ITO, IZO, IGO, ZnO, graphene, or graphene oxide. However, the present invention is not limited thereto.

When the crystals of the first sub-conductive semiconductor layer 31' grow, the crystals are not uniform at a crystal grain boundary, and, thus, defects may be formed in the grown semiconductor layer. The defects may be a factor that hinders the electron mobility in the semiconductor layers 310 and 320 of the light emitting element 300 or the luminous efficiency of the light emitting element 300.

In contrast, when the first mask layer 20 is formed to grow crystals of the first sub conductive semiconductor layer 31', the defects of the crystal grain boundary are hindered by the mask pattern 21, and only the defects formed in the openings 22 remain. Therefore, it is possible to reduce the number of defects formed in the finally formed first semiconductor layer 310.

Further, as will be described later, the first mask layer 20 may be etched and removed when the light emitting element 300 is separated from the substrate 10 or the lower panel 11. Accordingly, the separation surface of the light emitting element 300 formed on the mask pattern 21 of the first mask layer 20 may have the same shape as the surface of the mask pattern 21. That is, the separation surface of the light emitting element 300 may have any of various shapes depending on the pattern of the first mask layer 20, the shape or structure of the mask pattern 21, and the like. As described with reference to FIG. 8, this may be related to the problem of disconnection in connection with the contact electrodes 230 and 240 depending on the shape of one side surface (or a separation surface) of the light emitting element 300. Further details thereof will be described later.

Next, a first conductive semiconductor layer 31, an active material layer 35, and a second conductive semiconductor layer 32 are laminated on the first mask layer 20 to form an element stack 30'. The first conductive semiconductor layer 31, the active material layer 35, and the second conductive semiconductor layer 32, which are laminated on the first mask layer 20 are separated from the substrate 10 or the lower panel 11, thereby forming a light emitting element 300. Accordingly, the first conductive semiconductor layer 31, the active material layer 35, and the second conductive semiconductor layer 32 may include the same materials as those of the light emitting element 300 described with reference to FIGS. 2 to 6. Herein, a method of forming the first conductive semiconductor layer 31, the active material layer 35, and the second conductive semiconductor layer 32 will be described in further detail.

First, the first conductive semiconductor layer 31 includes the same material as the first sub conductive semiconductor layer 31', and may be formed by metal organic chemical vapor deposition (MOCVD) as an example of the above-described methods. The crystals of the first sub conductive semiconductor layer 31' may provide seed crystals of the first conductive semiconductor layer 31 and may grow through the openings 22 of the first mask layer 20.

Figure 10:
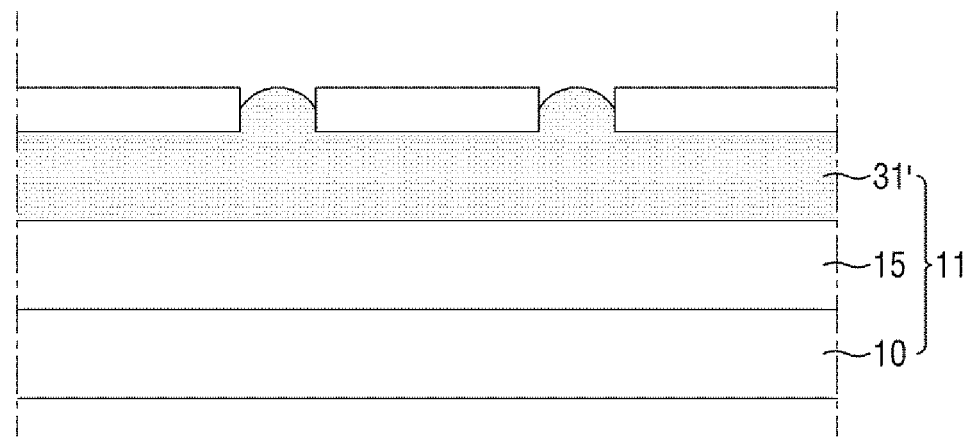
Figure 11:
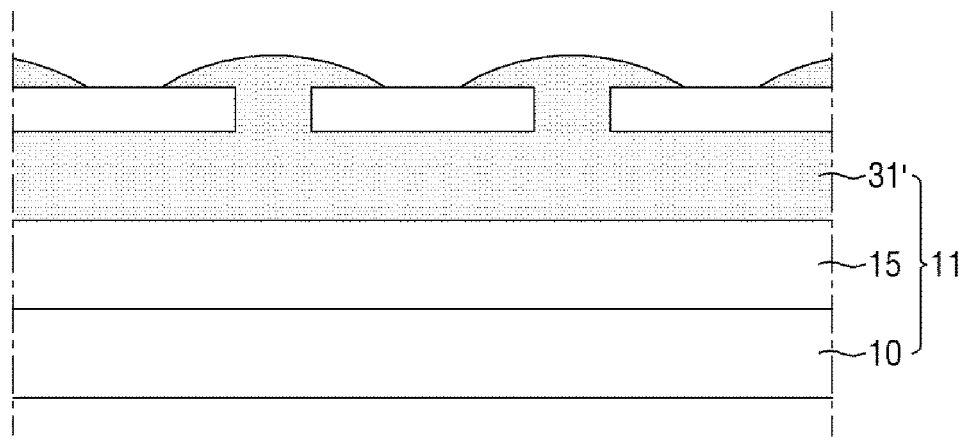
Figure 12:
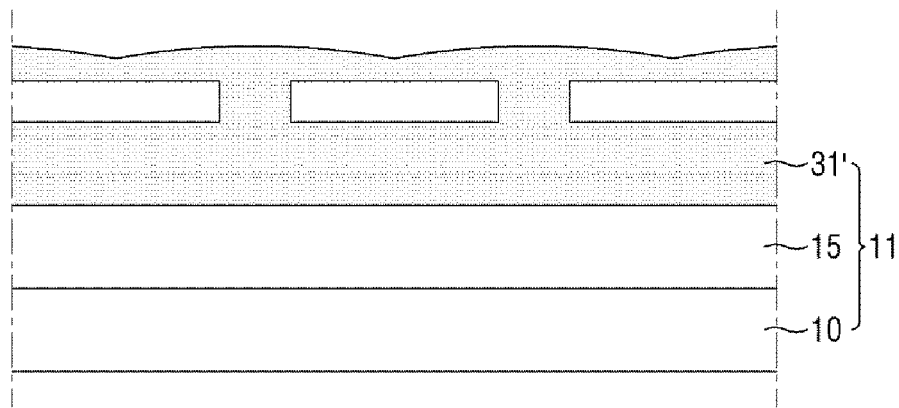

FIGS. 10 to 12 are schematic views illustrating a process of growing the crystals of the first sub conductive semiconductor layer 31' according to an embodiment.

In an embodiment, the crystals of the first sub conductive semiconductor layer 31' in the region overlapping the openings 22 grow in the vertical direction, and grow to the same level as the thickness of the mask pattern 21. In an embodiment, the crystals grown in the openings 22 grow upward relative to the mask pattern 21 in a horizontal direction to spread the crystals of the first sub conductive semiconductor layer 31'. Finally, the crystals of the first sub conductive semiconductor layer 31' merge in a part of the region of the mask pattern 21 to form a part of the first conductive semiconductor layer 31. The crystals of the first sub conductive semiconductor layer 31' become a crystal grain boundary on the mask pattern 21, and, thus, defects may be formed. However, the defects formed in the region overlapping the mask pattern 21 may not grow, and the number of defects in the finally formed first semiconductor layer 310 may be decreased.

Figure 13:
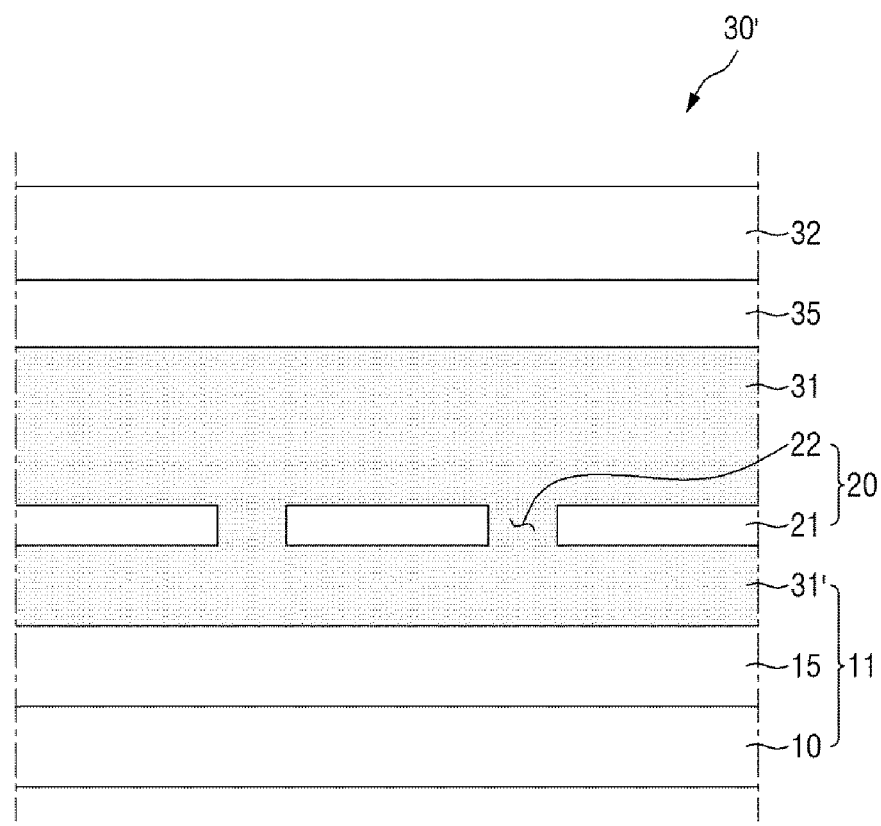

As shown in FIG. 13, when the crystals of the first sub conductive semiconductor layer 31' grow to form the first conductive semiconductor layer 31, the active material layer 35 and the second conductive semiconductor layer 32 are laminated on the first conductive semiconductor layer 31 to form an element laminate 30'. In an embodiment, the active material layer 35 and the second conductive semiconductor layer 32 are formed in the same manner as the first conductive semiconductor layer 31 except that the first mask layer 20 is formed and grown through the openings 22. Further details thereof will not be described.

Figure 14:
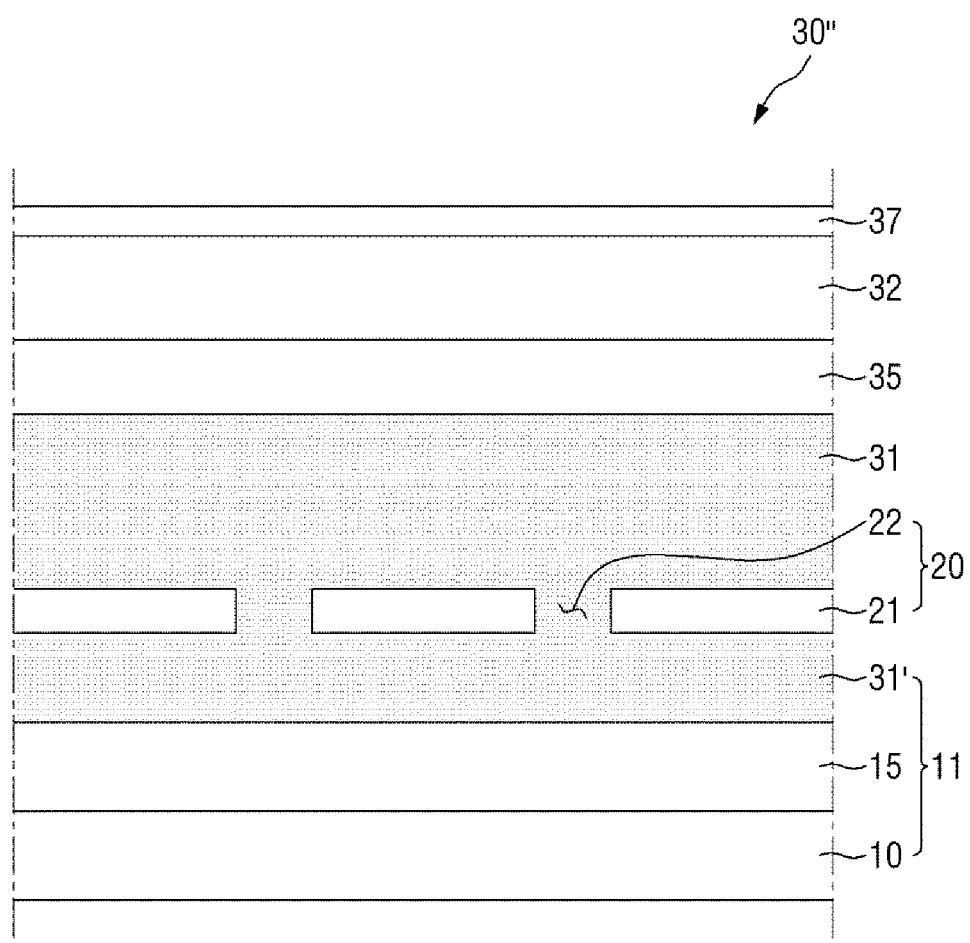

In an embodiment, the light emitting element 300 may further include an electrode layer 360 or 370 on at least one of the first semiconductor layer 310 and the second semiconductor layer 320. Therefore, the method may further include a step of forming a conductive electrode layer 37 on the formed element laminate 30'. Referring to FIG. 14, it can be seen that the conductive electrode layer 37 is formed on the second conductive semiconductor layer 32. The conductive electrode layer 37 may include a conductive material as described above, and may be formed in the same manner as the second conductive semiconductor layer 32. The formed conductive electrode layer 37 may form ohmic contact or Schottky contact with the second conductive semiconductor layer 32. Herein, an element laminate 30' provided with only the conductive electrode layer 37 will be described as an example.

Next, the element laminate 30' is etched in the vertical direction to prepare element rods 30. The step of vertically etching the element laminate 30' may be performed by a generally used method. For example, the element rods 30 may be prepared by forming a second mask layer 40 including a hard mask layer and a nanopattern layer 42 on the element laminate 30' and then etching the second mask layer 40. A description thereof will be described with reference to FIGS. 15 and 16.

Figure 15:
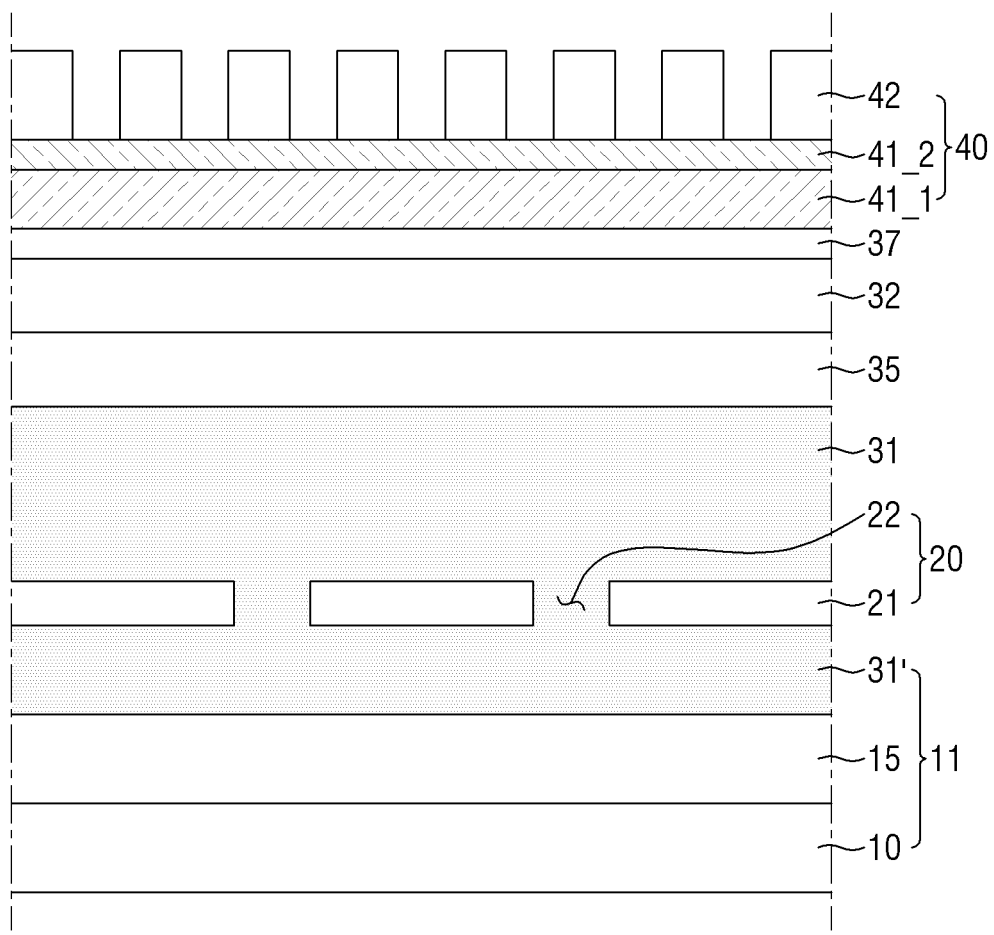
Figure 16:
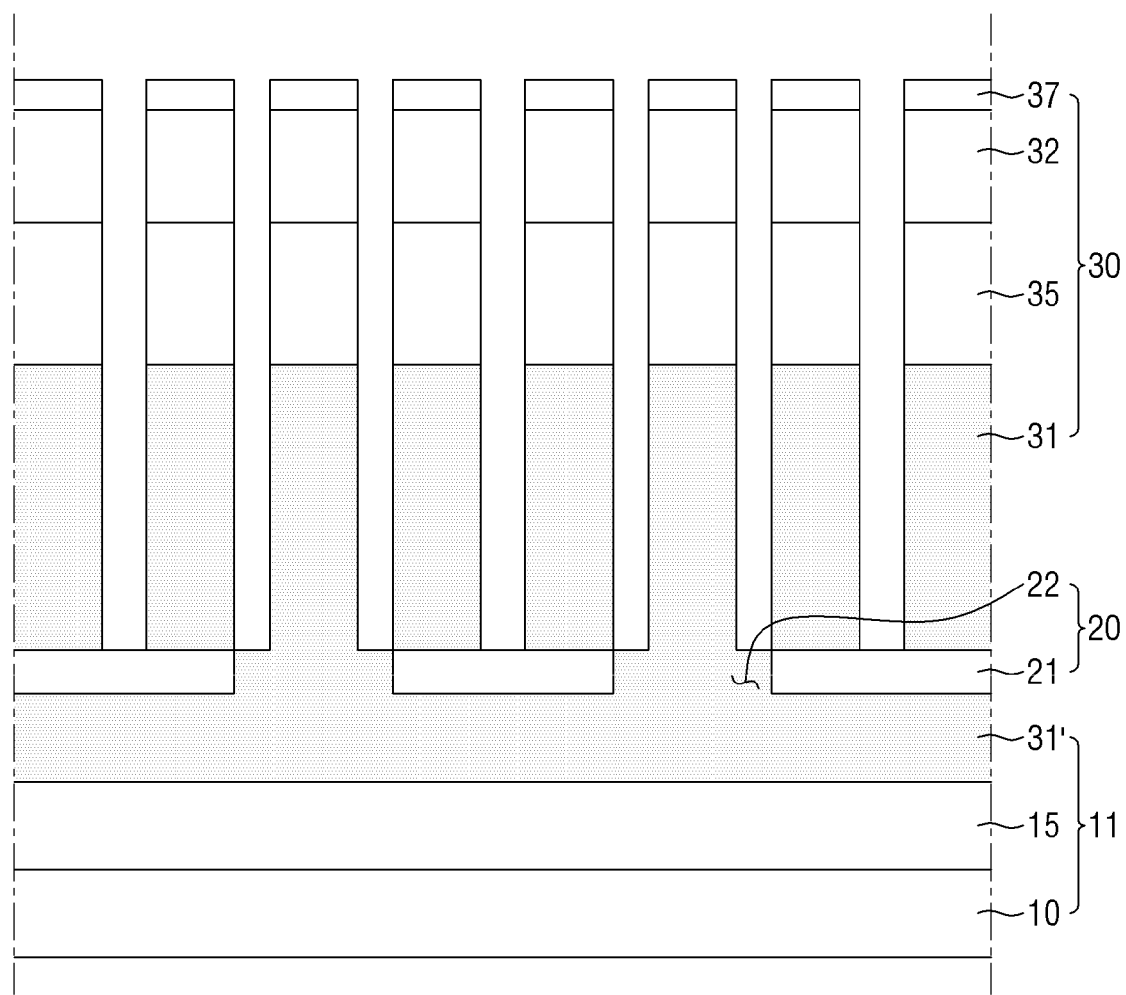

Referring to FIG. 15, a second mask layer 40 including a hard mask layer and a nanopattern layer 42 is formed on the second conductive semiconductor layer 32 of the element laminate 30'.

The hard mask layer may serve as a mask for continuously etching the first conductive semiconductor 31, the active material layer 35, and the second conductive semiconductor 32 included in the element laminate 30'. In an embodiment, the hard mask layer may include a first layer 41_1 including an insulating material and a second layer 41_2 including a metal.

As the insulating material included in the first layer 41_1 of the hard mask layer, oxides or nitrides may be used. Examples of the insulating material may include silicon oxide (SiOx), silicon nitride (SiNx), and silicon oxynitride (SiOxNy). The thickness of the first layer 41_1 may be in a range from 0.5 μm to 1.5 μm, but is not limited thereto.

The material of the second layer 41_2 is not particularly limited and may be a commonly known material capable of serving as a mask for continuously etching the element laminate 30'. For example, the second layer 41_2 may include chromium (Cr) or the like. The thickness of the second layer 41_2 may be in a range from 30 nm to 150 nm, but is not limited thereto.

Next, a nanopattern layer 42 in which nanopatterns are arranged to be spaced apart from each other may be formed on the hard mask layer. In the nanopattern layer 42, the nanopatterns spaced apart from each other may serve as a mask for continuously etching the element laminate 30'. The method of forming the nanopattern layer 42 is not particularly limited as long as nanopatterns including a polymer, polystyrene spheres, and silica spheres can be formed.

As an example, when the nanopatterning layer 42 includes a polymer, a commonly known method of forming a pattern using a polymer may be employed. For example, the nanopattern layer 42 including a polymer may be formed by a method such as photolithography, e-beam lithography, or nano-imprint lithography.

The structure and shape of the nanopattern layer 42 and the intervals between the nanopatterns may be related to the form of the finally manufactured light emitting element 300. However, as described above, since the light emitting element 300 may have any of various shapes, the structure of the nanopattern layer 42 is not particularly limited. For example, when the nanopattern layer 42 has circular patterns spaced apart from each other, the element rods 30 prepared by vertically etching the element laminate 30' may have a cylindrical shape. Thus, the light emitting element 300 separated from the substrate 10 or the lower panel 11 may have a cylindrical shape. However, the present invention is not limited thereto.

Next, when the second mask layer 40 is formed on the element laminate 30', the region where the nanopattern layer 42 is formed is not etched, and the region where the nanopatterns of the nanopattern layer 42 are spaced apart from each other is vertically etched to form holes. The holes may be selectively formed from the hard mask layer to the region where the first mask layer 20 is formed.

The method of forming the holes by etching the element laminate 30' may be performed in a conventional manner. Examples of etching may include dry etching, wet etching, reactive ion etching (RIE), and inductively coupled plasma reactive ion etching (ICP-RIE). Dry etching is suitable for forming holes by vertical etching because anisotropic etching is possible. In an embodiment, when the above-described etching method is used, an etchant may be $Cl_2$ or $O_2$. However, the present invention is not limited thereto.

In some embodiments, the etching of the element laminate 30' may be performed by using a combination of dry etching or wet etching. For example, first, the element laminate 30' may be etched in a depth direction by dry etching, and then the etched side walls of the element laminate 30' may be placed in a plane perpendicular to the surface thereof by wet etching as isotropic etching.

The second mask layer 40 remaining on the vertically etched element laminate 30' is removed by a commonly known method, for example, dry etching or wet etching, to form element rods 30.

Finally, at least a part of the element rod 30 is separated from the substrate 10 or the lower panel 11 by forming an insulating film 38 on the element rod 30 and removing the mask pattern 21 to form the light emitting element 300.

The insulating film 38, which is film formed on the outer surface of the element rod 30, may be formed by applying an insulating material onto the outer surface of the vertically etched element rod 30 or immersing the outer surface thereof into the insulating material, but the present invention is not limited thereto. For example, the insulating film 38 may be formed by atomic layer deposition (ALD). The insulating film 38 may form an insulating layer 380 of the light emitting element 300. As described above, in an embodiment, the insulating film 38 may include silicon oxide (SiOx), silicon nitride (SiNx), silicon oxynitride (SiOxNy), aluminum oxide ($Al_2O_3$), or aluminum nitride (AlN).

Figure 17:
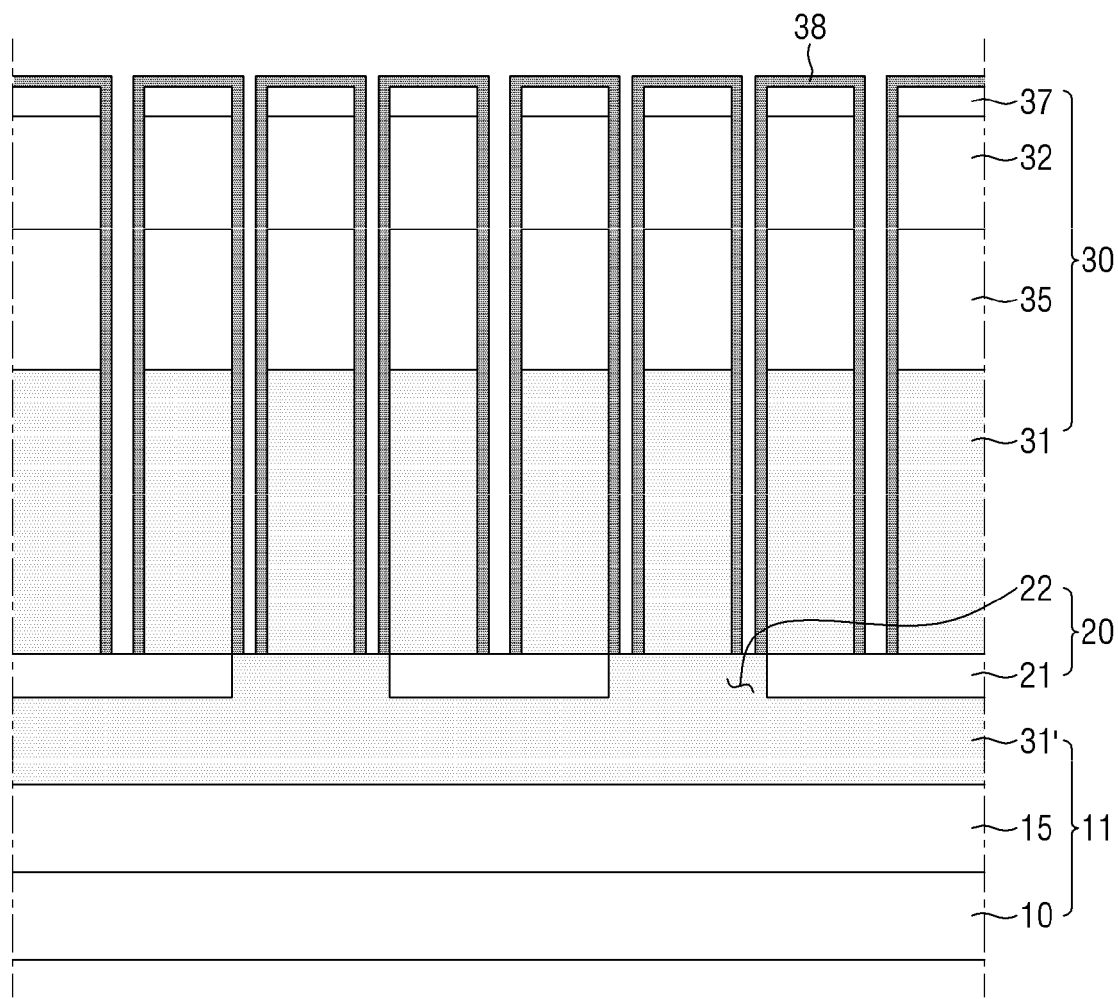
Figure 18:
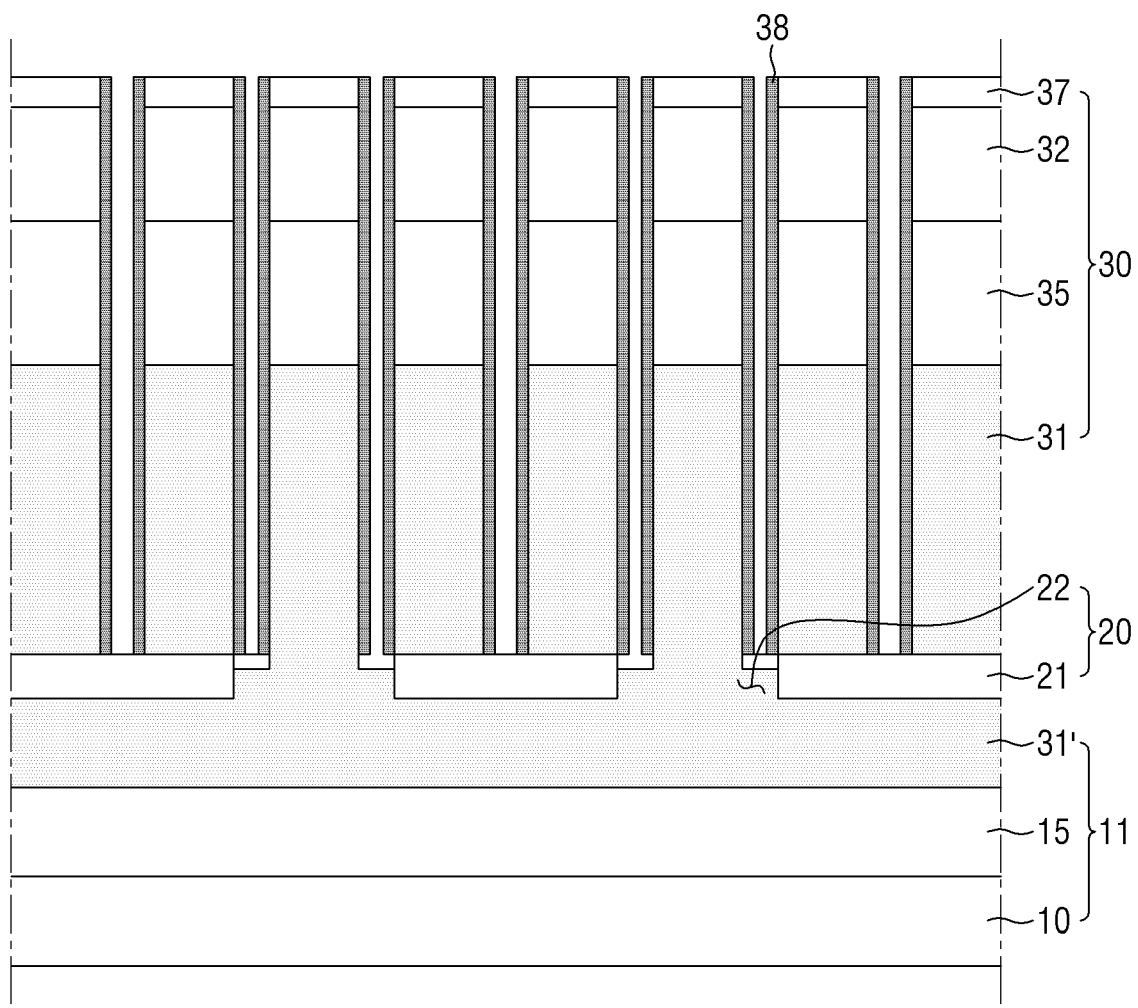

Referring to FIG. 17, the insulating film 38 may also be formed on a part of the surface of the mask pattern 21 exposed to the outside by etching the element rods 30 to be spaced apart from each other in addition to the outer surface of the element rod 30. When the insulating film 38 is formed even on the second conductive electrode 37 which is an upper surface of the element rod 30, the connection of the light emitting element 300 with the contact electrodes 230 and 240 may be isolated. Therefore, the insulating film 38 formed in a direction perpendicular to the length direction of the element rod 30, that is, in a direction parallel to the substrate 10 or the lower panel 11 needs to be partially removed. That is, as shown in FIG. 18, at least the insulating film 38 disposed on the upper surface of the element rod 30 is removed to expose the upper surface of the element rod 30. For this purpose, a process such as dry etching or etching-back which is anisotropic etching may be performed.

Figure 19:
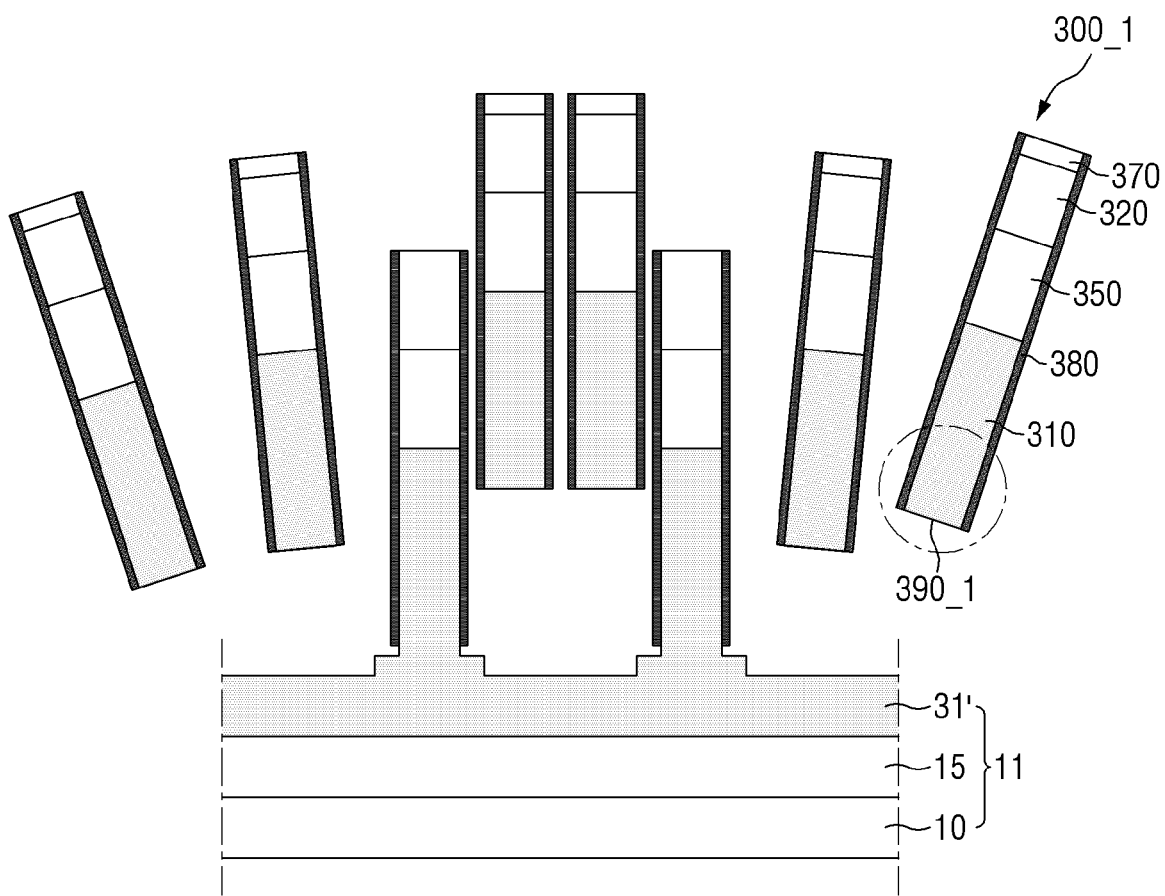

At least a part of the element rod 30 is separated from the substrate 10 or the lower panel 11 by removing the mask pattern 21 to manufacture the light emitting element 300. The mask pattern 21 may be dissolved by an etchant, such as hydrofluoric acid (HF). Therefore, as shown in FIG. 19, the element rod 30 formed on the mask pattern 21 of the first mask layer 20 dissolves the mask pattern 21 and is chemically separated (chemically lifted off) from the lower panel 11 to manufacture a light emitting element 300_1. Since the light emitting element 300_1 is separated by dissolving and removing the mask pattern 21, the separation surface 390_1 thereof may be relatively flat. In some embodiment, a surface roughness of the separation surface, which is a surface on which the element rod 30 is separated from the lower panel 11, may be different from a surface roughness of the upper surface of the second conductive semiconductor layer 32. But, the present invention is not limited thereto and, in some cases, the separation surface may be substantially flat and parallel to the upper surface of the second conductive semiconductor layer 32.

Figure 20:
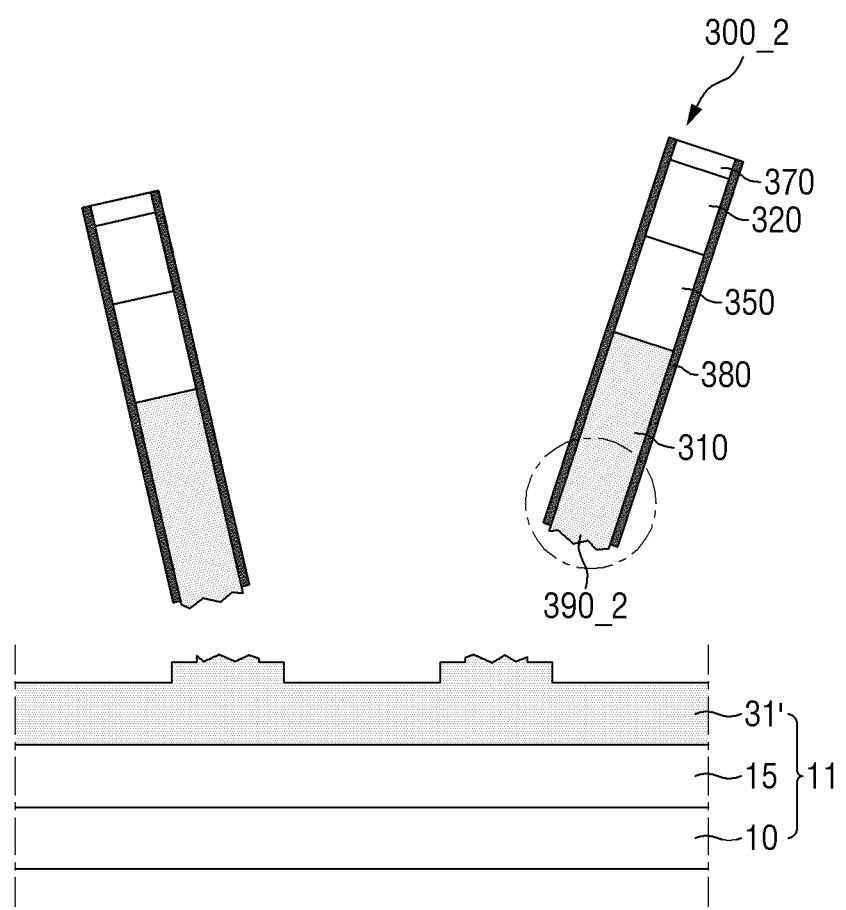

On the other hand, the element rods 30 formed on the openings 22 of the first mask layer 20 remain unremoved. Referring to FIG. 20, the element rods 30 formed on the openings 22 of the first mask layer 20 may be separated from the substrate 10 or the lower panel 11 by a physical method. In a light emitting element 300_2 manufactured through the above method, a separation surface 390_2, which is a surface separated from the substrate 10, may have a concavo-convex structure, or a partially inclined region may be formed.

As described above, this may cause a problem of disconnection of a contact electrode material when the light emitting element 300_2 is connected to the contact electrodes 230 and 240. In order to solve this problem, the separation surface 390_2 of the light emitting element 300_2 may be required to be flattened by additional etching.

On the other hand, the light emitting element 300_1 manufactured according to an embodiment is formed on the mask pattern 21 of the first mask layer 20 disposed in a part of a region of the element laminate 30', and is separated by a chemical method to planarize the separation surface 390_1. That is, the element rod 30 formed through crystal growth may be separated from the substrate 10, and the planarization of the separation surface 390_1 may be performed.

That is, referring to FIGS. 19 and 20, the first mask layer 20 formed on the lower panel 11 may be removed by etching, and the element rods 30 may be separated. The element rods 30 formed on the mask pattern 21 of the first mask layer 20 may be separated by etching, and the element rods 30 formed on the openings 22 may be separated by a physical method. Here, the light emitting elements 300_1 and 300_2 respectively separated from the mask pattern 21 and the openings 22 may have separation surfaces having different shapes from each other.

Herein, the separation surfaces 390_1 and 390_2 of the light emitting elements 300_1 and 300_2 will be described with reference to FIGS. 21 and 22. For convenience of explanation, the light emitting element 300_1 formed on the mask pattern 21 and separated therefrom is referred to as a first light emitting element 300_1, and the light emitting element 300_2 formed on the opening 22 and separated therefrom is referred to as a second light emitting element 300_2.

Figure 21:
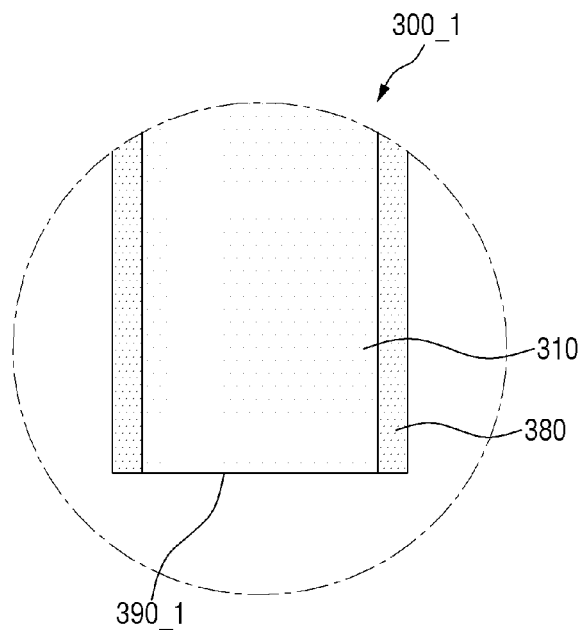
FIGS. 21 and 22 are enlarged views showing separation surfaces of a first light emitting element and a second light emitting element according to an embodiment.
Figure 22:
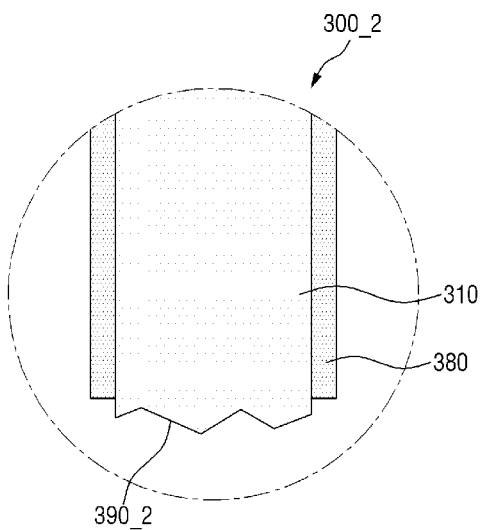

FIGS. 21 and 22 are enlarged views showing the separation surfaces 390_1 and 390_2 of the first light emitting element 300_1 and the second light emitting element 300_2 according to an embodiment.

Referring to FIGS. 21 and 22, the first light emitting element 300_1 and the second light emitting element 300_2 have the separation surfaces 390_1 and 390_2 on which the first semiconductor layer 310 is disposed. The separation surface 390_1 of the first light emitting element 300_1 is a surface which is in contact with the mask pattern 21 of the first mask layer 20. When the first light emitting element 300_1 is separated, the separation surface 390_1 has a relatively flat shape. On the other hand, the separation surface 390_2 of the second light emitting element 300_2 may be separated from a region contacting the opening 22 of the first mask layer 20. The element rod 30 formed on the opening 22 is not separated together when removing the first mask layer 20, and remains in engagement with the first sub conductive semiconductor layer 31'. When this element rod 30 is separated by removing the first mask layer 20 through a physical method, the separation surface 390_2 of the second light emitting device 300_2 has a rough surface.

Since the second light emitting element 300_2 is separated from the lower panel 11 by a physical method, it is not smoothly separated from a crystal grain boundary between the first sub conductive semiconductor layer 31' and the first semiconductor layer 310. Since the portion of the second light emitting element 300_2, having a relatively weak lattice attraction, is decomposed at each crystal grain boundary, the separation surface 390_2 of the second light emitting element 300_2 has various shapes without uniformity.

In particular, when a part of the separation surface 390_2 of the second light emitting element 300_2 protrudes or recesses to be inclined or have a rough surface, an empty space may be formed in an area connected to the contact electrodes 230 and 240. Accordingly, the disconnection of a contact electrode material may occur in an area III-III' where the light emitting element 300 of FIG. 7 is connected to the contact electrodes 230 and 240. As described above, the disconnection of the contact electrode material may cause a problem of a short circuit failure and light-emitting failure of the light emitting element 300.

On the other hand, when the separation surface 390_1 of the first light emitting element 300_1 is relatively flat, the disconnection of a contact electrode material may not occur in the area III-III' of FIG. 7, and the short circuit failure and light-emitting failure of the light emitting element 300_1 with the semiconductor layers 310 and 320 or the electrode layers 360 and 370 may be prevented or substantially prevented. As a result, the reliability of the light emitting element 300 in the display device may be improved.

According to an embodiment, the roughness of the separation surface 390_1 of the first light emitting element 300_1 may have a value of about 10% of the roughness of the separation surface 390_2 of the second light emitting element 300_2. For example, the roughness of the separation surface 390_1 of the first light emitting element 300_1 may have a value of 8 nm Ra to 12 nm Ra, and the roughness of the separation surface 390_2 of the second light emitting element 300_2 may have a value of 90 nm Ra to 110 nm Ra. However, the present invention is not limited thereto.

As described above, the first mask layer 20 may have any of a variety of structures. Since the light emitting element 300 according to an embodiment has a relatively flat separation surface, the structure of the first mask layer 20 is not particularly limited within a range in which a disconnection failure does not occur in connection with the first contact electrode 230 or the second contact electrode 240. Herein, various structures of the first mask layer 20 formed on the substrate 10 or the lower panel 11 will be described.

FIGS. 23 to 26 are plan views of lower panels 11 on which a first mask layer 20 is formed according to an embodiment.

The first mask layer 20 formed on the lower panel 11 may include mask patterns 21 and openings 22, and may form patterns on at least a part of the lower panel 11. The mask patterns 21 may be disposed to be spaced apart from each other, and the openings 22 may be formed in the region where the mask patterns 21 are spaced apart from each other.

Figure 23:
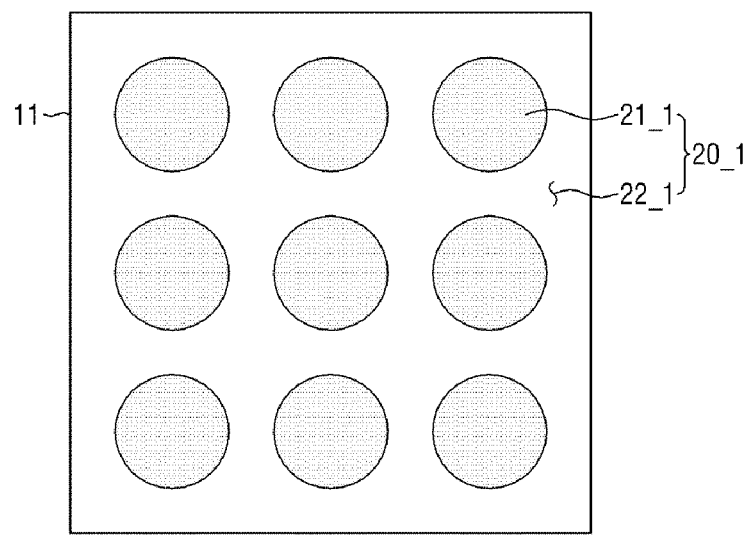
FIGS. 23 to 26 are plan views of lower panels on which a first mask layer is formed according to an embodiment.

In an embodiment, as shown in FIG. 23, a first mask layer 20_1 may include a plurality of planar circular mask patterns 21_1, and the plurality of planar circular mask patterns 21_1 may be disposed to be spaced apart from each other. Openings 22_1 may be formed in the region where the plurality of mask patterns 21_1 are spaced apart from each other.

Figure 24:
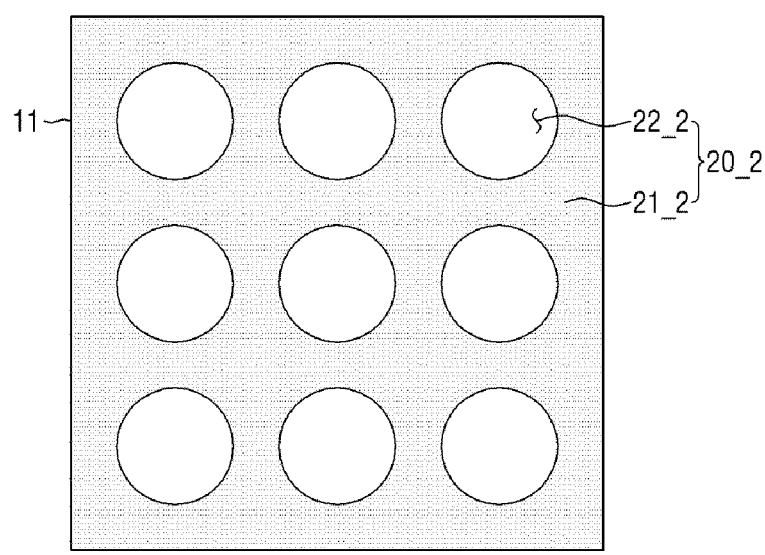

FIG. 23 shows a configuration in which the circular mask patterns 21_1 are formed to protrude from the lower panel 11 and the openings 22_1 are formed to recess from the lower panel 11. However, the present invention is not limited thereto. As shown in FIG. 24, circular openings 22_2 may be formed to recess from the lower panel 11, and mask patterns 21_2 may be formed in other region to protrude from the lower panel 11. When the material of the mask patterns 21_1 is deposited in the step of forming the first mask layer 20_1, the mask patterns 21_1 may protrude according to the pattern of the first mask layer 20_1. In contrast, when the openings 22_2 are formed by forming a layer including the mask patterns 21_2 on the lower panel 11 and then etching the layer according to the pattern of a first mask layer 20_2, the openings 22_2 may be formed to recess according to the shape of the pattern.

Figure 25:
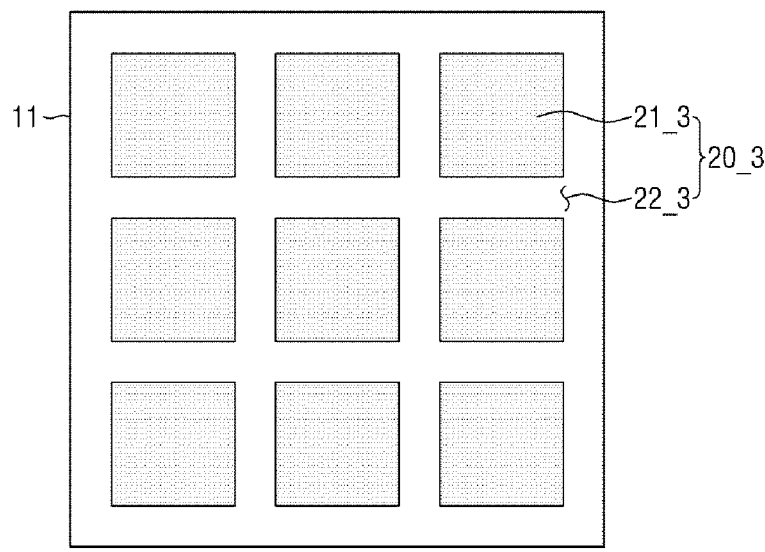

Further, as shown in FIG. 25, each of mask patterns 21_3 may have a rectangular shape. However, the present invention is not limited thereto, and the mask patterns 21_3 formed on the lower panel 11 may have any of various shapes. A first mask layer 20_3 of FIG. 25 may be the same as the first mask layer 20_1 of FIG. 21 except that the mask patterns 21_3 are formed to have a rectangular shape. Further, the first mask layer 20_3 of FIG. 25 may have a configuration in which the mask patterns 21_3 are formed to protrude from the lower panel and openings 22_3 are formed to recess from the lower panel 11, as shown in FIG. 23.

Figure 26:
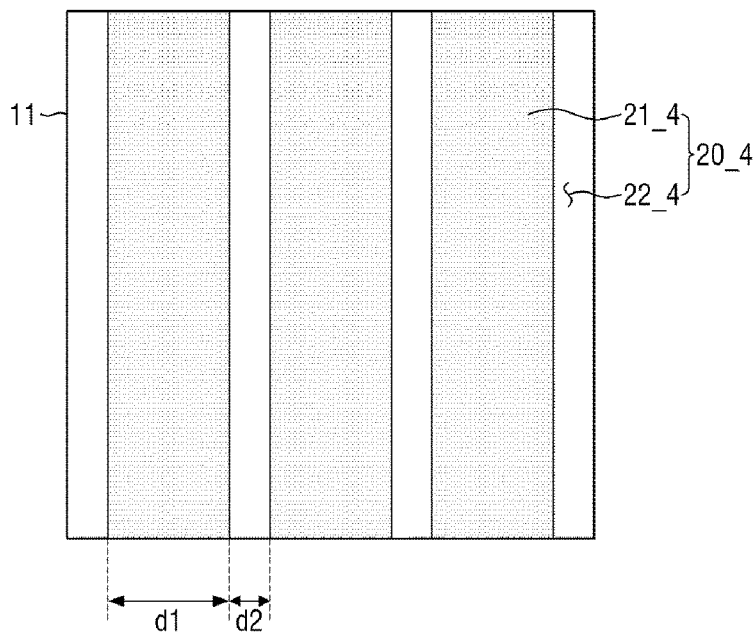

As shown in FIG. 26, a first mask layer 20_4 may include a plurality of linear mask patterns 21_4 on the lower panel 11, and the plurality of linear mask patterns 21_4 may be disposed to be spaced apart from each other. Openings 22_4 may be formed in the region where the plurality of linear mask patterns 21_4 are spaced apart from each other. According to an embodiment, the first mask layer 20_4 may be configured such that at least one mask pattern 21_4 is disposed between one side of the lower panel 11 and the other side thereof facing the one side thereof. The mask patterns 21_4 may be disposed to be spaced apart from each other in a second direction perpendicular to a first direction which is a direction in which the mask patterns 21_4 are connected to each other, and the openings 22_4 may be formed therebetween. The first mask layer 20_4 of FIG. 26 is the same as the first mask layer 20_3 of FIG. 25 except that the mask patterns 21_4 are formed in a linear shape.

Referring to FIGS. 10 to 12 again, the crystals of the first sub conductive semiconductor layer 31' may grow in the vertical direction through the opening 22 and may grow in a horizontal direction on the mask pattern 21. Here, the ratio of a diameter d1 (or width) of the mask pattern 21 to a diameter d2 (or width) of the opening 22 corresponding to the distance between the mask patterns 21 may be varied. However, when the diameter d2 of the opening 22 is too small, the crystal growth rate of the first sub conductive semiconductor layer 31' may be slow. On the contrary, when the diameter d2 of the opening 22 is too large, the growth of crystals on the first mask layer 20 in the horizontal direction may be slower than the growth of crystals on the first mask layer 20 in the vertical direction. Accordingly, the crystals of the first sub conductive semiconductor layer 31' may not be merged on the mask pattern 21. In an embodiment, therefore, the diameter ratio of the mask pattern 21 to the opening 22 in the first mask layer 20 is adjusted within a specific range.

In an embodiment, the diameter d1 of the mask pattern 21 measured in one axial direction may be 2.5 times to 3.5 times the diameter d2 thereof measured in a direction the same as the one axial direction. In other words, the diameter d1 between any first opening 22 and the second opening 22 formed at the opposite side of the mask pattern 21 adjacent to the first opening 22 may be 2.5 times to 3.5 times the diameter d2 of the opening 22. As shown in FIG. 26, the diameter d1 of the mask pattern 21_4 may be larger than the diameter d2 of the opening 22_4. For example, when the diameter d1 of the mask pattern 21 has a range of 3.5 μm to 4.5 μm, the diameter d2 of the opening 22 may have a range of 700 nm to 1.5 μm.

When the diameters of the mask pattern 21 and the opening 22 of the first mask layer 20 have values within the above range, the growth of crystals of the first sub conductive semiconductor layer 31' in the vertical direction and the merging of the crystals on the mask pattern 21 may be appropriately performed. In particular, in order to merge the crystals of the first sub conductive semiconductor layer 31' on the mask pattern 21, the diameter d1 of the mask pattern 21 may be adjusted so as not to be too large as compared with the diameter d2 of the opening 22. Accordingly, a part of the first conductive semiconductor layer 31 is formed on the first mask layer 20, and the first conductive semiconductor layer 31 may be entirely formed through continuous crystal growth.

Further, as described above, the mask pattern 21 of the first mask layer 20 may include at least one of an insulating material and a conductive material. Thus, a mask pattern 21_5 (see FIG. 27) may be formed of a single layer or a multilayer of two or more including the above materials. According to an embodiment, the mask pattern 21_5 may have a structure in which one or more layers are laminated, may be provided with an insulating material layer 21_5' including an insulating material on the surface thereof contacting the lower panel, and may be provided with a conductive material layer 21_5" including a conductive material on the insulating material layer 21_5'.

Figure 27:
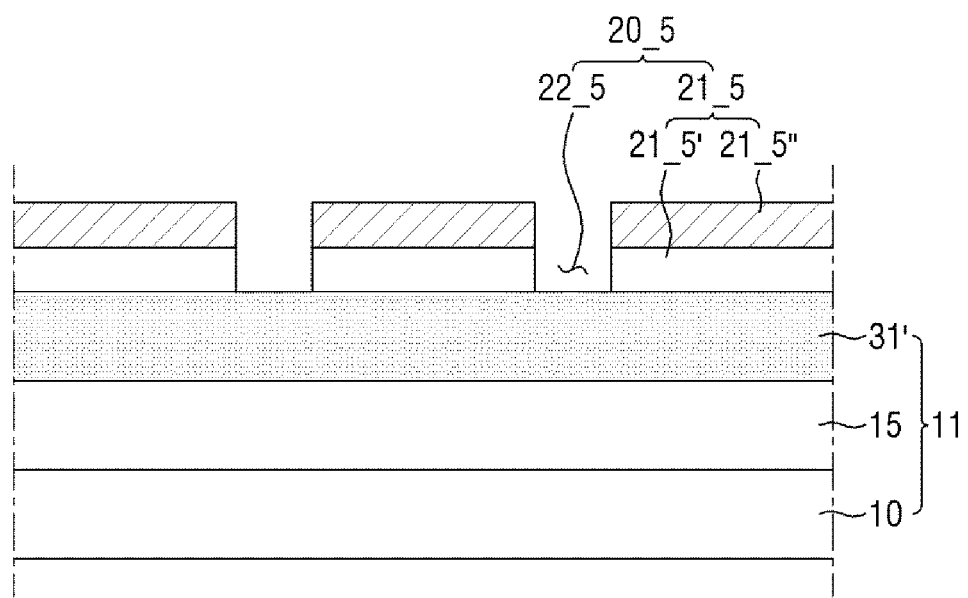
FIG. 27 is cross-sectional view of a lower panel on which a first mask layer is formed according to another embodiment.

FIG. 27 is cross-sectional view of a lower panel 11 on which a first mask layer 20_5 is formed according to another embodiment.

In an embodiment, the mask pattern 21_5 may include an insulating material layer 21_5' disposed on a surface contacting the lower panel 11 and a conductive material layer 21_5" disposed thereon. However, the present invention is not limited thereto, and the mask pattern 21_5 may include three or more different material layers, and the laminating order thereof may be reversed. FIG. 27 illustrates a double-layer mask pattern 21_5 in which an insulating material layer 21_5' and a conductive material layer 21_5" are sequentially laminated.

The mask pattern 21_5 may be formed in multiple layers including combinations of the above-described materials. For example, when the mask pattern has a double-layered structure, it has a structure of an insulating material layer 21_5'/a conductive material layer 21_5", and may include ITO/SiOx, ZnO/SiOx, ITO/ZnO, ZnO/ITO, graphene/SiOx, or graphene/graphene oxide. In an embodiment, when the mask pattern has a structure in which an insulating material layer 21_5' and a conductive material layer 21_5" are sequentially laminated upward, only the insulating material layer 21_5' may be etched in the step of removing the mask pattern 21_5, that is, at the time of separating the element rods 30 from the substrate 10 or the lower panel 11, and the conductive material layer 21_5" may be attached to the light emitting element 300 to form an electrode layer 360. However, this is merely an embodiment of the present invention, and the present invention is not limited thereto and may have various types of structures.

As described above, according to a method of manufacturing a light emitting element according to an embodiment, element rods grown on a substrate are separated from the substrate by a chemical separation method, such that the separation surface of the manufactured light emitting element may be flat. Further, the light emitting element may be manufactured by forming an insulating layer on the outer surface of the element rod and then separating the element rod from the substrate. Therefore, a light emitting element having both flat side surfaces may be manufactured without an additional etching process.

Further, since the light emitting element disposed between the electrodes of the display device has both substantially flat surfaces which are substantially parallel to each other, it is possible to prevent or substantially prevent disconnection or short failure of a contact electrode material at the time of connecting with the contact electrode.

However, the effects of the present invention are not limited by the foregoing, and other various effects are anticipated herein.

Although some exemplary embodiments of the present invention have been disclosed for illustrative purposes, those skilled in the art will appreciate that various modifications, additions, and substitutions are possible, without departing from the scope and spirit of the invention as disclosed in the accompanying claims.

What is claimed is:

1. A method of manufacturing a light emitting element, the method comprising:
   preparing a lower panel comprising a substrate and a first sub semiconductor layer on the substrate;
   forming a first mask layer comprising at least one mask pattern on the lower panel and spaced apart from each other, and an opening region in which the mask patterns are spaced apart from each other;
   forming an element laminate on the first mask layer, comprising laminating a first conductive semiconductor layer, an active material layer, and a second conductive semiconductor layer;
   forming a plurality of element rods by etching the element laminate in a vertical direction to the lower panel; and
   removing the mask pattern to separate the plurality of element rods from the lower panel,
   wherein the plurality of element rods includes a first element rod formed on the mask pattern and a second element rod formed on the opening region, and
   in the removing the mask pattern, the first element rod is separated from the lower panel.

2. The method of claim 1, further comprising separating the second element rod from the lower panel after removing the mask pattern.

3. The method of claim 2, wherein the separated first element rod and the separated second element rod include a separation surface, at which the element rod is separated from the lower panel, and
   a first separation surface of the separated first element rod is substantially flat and parallel to an upper surface of the second conductive semiconductor layer.

4. The method of claim 3, wherein the first separation surface has a surface roughness from 8 nm Ra to 12 nm Ra.

5. The method of claim 4, wherein a second separation surface of the separated second element rod has a greater surface roughness than the first separation surface.

6. The method of claim 1, wherein the forming the plurality of element rods comprises:
   forming a second mask layer on the element laminate, the second mask layer including a hard mask layer and a pattern layer in which at least one pattern is spaced apart from each other on the hard mask layer;
   vertically etching a region in which the patterns are spaced apart from each other to form a hole; and
   removing the second mask layer.

7. The method of claim 6, wherein the pattern of the pattern layer has a circular structure in a plan view.

8. The method of claim 1, wherein the forming the plurality of element rods comprises forming an insulating film on a side surface of the element rod; and
   the removing the mask pattern comprises dissolving the mask pattern to separate the element rod provided with the insulating film from the lower panel.

9. The method of claim 8, wherein the forming the element laminate further comprises forming an electrode material layer on the second conductive semiconductor layer.

10. The method of claim 1, wherein the mask pattern comprises at least one selected from silicon oxide, silicon nitride, silicon oxynitride, ITO, ZnO, IGO, graphene, and graphene oxide.

11. The method of claim 1, wherein the mask patterns are spaced apart from each other in a first direction which is parallel to an upper surface of the lower panel, and
    in the first mask layer, a ratio of a length of the mask pattern measured in the first direction to a length of the opening region measured in the first direction is from 2.5:1 to 3.5:1.

12. The method of claim 11, wherein the mask patterns are spaced apart from each other in the first direction and a second direction which intersects with the first direction.

13. The method of claim 11, wherein the mask patterns extend to a second direction which intersects with the first direction.

14. The method of claim 1, wherein the mask pattern comprises an insulating material layer comprising an insulating material on a surface contacting the lower panel, and
    a conductive material layer comprising a conductive material on the insulating material.

15. The method of claim 14, wherein the conductive material layer is attached to the light emitting element in the forming of the mask pattern to form an electrode layer.

* * * * *